United States Patent
Isobe et al.

(10) Patent No.: US 7,940,145 B2
(45) Date of Patent: May 10, 2011

(54) THIN FILM PIEZOELECTRIC VIBRATOR, THIN FILM PIEZOELECTRIC BULK ACOUSTIC WAVE RESONATOR, AND RADIO-FREQUENCY FILTER USING SUCH RESONATOR

(75) Inventors: Atsushi Isobe, Kodaira (JP); Kengo Asai, Hachioji (JP); Hisanori Matsumoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 524 days.

(21) Appl. No.: 11/979,905

(22) Filed: Nov. 9, 2007

(65) Prior Publication Data

US 2008/0111651 A1    May 15, 2008

(30) Foreign Application Priority Data

Nov. 10, 2006   (JP) .................. 2006-305781

(51) Int. Cl.
*H03H 9/205*   (2006.01)
(52) U.S. Cl. .................. 333/187; 333/189; 333/199
(58) Field of Classification Search .................. 333/189, 333/199, 187; 310/369, 322
See application file for complete search history.

(56) References Cited

U.S. PATENT DOCUMENTS

| | | | | |
|---|---|---|---|---|
| 5,644,274 A * | 7/1997 | Kaida | ............................. | 333/189 |
| 5,717,365 A * | 2/1998 | Kaida et al. | ..................... | 333/187 |
| 6,111,338 A * | 8/2000 | Otsuchi et al. | ................. | 310/352 |
| 6,466,107 B2 * | 10/2002 | Yamamoto | ..................... | 333/189 |
| 6,617,249 B2 | 9/2003 | Ruby et al. | | |
| 7,202,592 B2 * | 4/2007 | Takeda et al. | .................. | 310/357 |
| 7,276,994 B2 * | 10/2007 | Takeuchi et al. | ............... | 333/189 |
| 7,312,674 B2 * | 12/2007 | Duwel et al. | ................... | 333/186 |
| 7,365,619 B2 * | 4/2008 | Aigner et al. | .................. | 333/189 |

FOREIGN PATENT DOCUMENTS

JP    10-256618    3/1997
JP    2005-277861  3/2004

OTHER PUBLICATIONS

Rudolf F. Graf, Modern Dictionaryof Electronics, year 1999, Butterworth-Heinemann, pp. 284, 745.*
Piazza, G., et al., "Single-Chip Multiple-Frequency RF Microresonators Based on Aluminum Nitride Contour-Mode and FBAR Technologies", IEEE Ultrasonics Symposium, 2005, pp. 1187-1190.
Aigner, Robert, et al., "Bulk-Acoustic-Wave Filters" Performance Optimization and Volume Manufacturing, IEEE MTT-S Digest, 2003, pp. 2001-2004.

* cited by examiner

*Primary Examiner* — Robert Pascal
*Assistant Examiner* — Alan Wong
(74) *Attorney, Agent, or Firm* — Stites & Harbison, PLLC; Juan Carlos A. Marquez, Esq

(57) ABSTRACT

A thin film piezoelectric bulk acoustic wave resonator has a multilayer structure including a piezoelectric thin film, a first metal electrode film, and a second metal electrode film. At least a part of the piezoelectric thin film is interposed between the first and second metal electrodes. A resonance part and a connection part are formed on an insulating substrate as films by a thin film forming apparatus. The resonance part vibrates in radial extension mode with a center of the piezoelectric thin film used as a node, the piezoelectric thin film of two resonance parts is polarized in a direction perpendicular to a film surface, and a width of the connection part is one-fourth or less of a width of two resonance parts.

9 Claims, 26 Drawing Sheets

THIN FILM PIEZOELECTRIC VIBRATOR, THIN FILM PIEZOELECTRIC BULK ACOUSTIC WAVE RESONATOR, AND RADIO-FREQUENCY FILTER USING SUCH RESONATOR

CLAIM OF PRIORITY

The present invention claims priority from Japanese application JP 2006-305781 filed on Nov. 10, 2006, the content of which is hereby incorporated by reference into this application.

FIELD OF THE INVENTION

The present invention relates to a thin film piezoelectric vibrator and a thin film piezoelectric resonator (hereafter referred to as a "thin film piezoelectric bulk acoustic wave resonator") that both use piezoelectric/anti-piezoelectric effects of a piezoelectric thin film as well as use a resonance phenomenon of a bulk acoustic wave, and a radio-frequency filter using such a resonator.

BACKGROUND OF THE INVENTION

Film bulk acoustic wave resonators (FBARs) are widely known as thin film piezoelectric bulk acoustic wave resonators. Radial extension mode resonators (RE resonators) that vibrate in radial extension mode (hereafter referred to as "RE mode") with their center used as a vibration node and ring resonators are also known. Any of these resonators includes a piezoelectric material and metal electrodes provided on and below the piezoelectric material.

Disclosed in U.S. Pat. No. 6,617,249 issued to Ruby et al. on Sep. 9, 2003 is an FBAR that is able to shift a resonant frequency from others by additionally providing an auxiliary metal layer on a surface electrode layer, in order to manufacture resonators having different resonant frequencies.

Disclosed in "Single-Chip Multiple-Frequency RF Micro resonators Based on Aluminum Nitride Contour-Mode and FBAR Technologies" (G. Piazza et al., Proc. IEEE Ultrason. Symp., 18-21 Sep. 2005, pp. 1187-1190) is a ring resonator that is able to shift a resonant frequency from others by adjusting a mask size.

Disclosed in Japanese Patent Application Laid-Open Publication No. 10-256618 are a method for supporting multiple vibrators that vibrate in RE mode, at their centers and a method for supporting an RE resonator in which wiring is connected to an electrode at such a center.

Disclosed in Japanese Patent Application Laid-Open No. 2005-277861 is a microresonator that includes multiple resonators and corresponding multiple electrodes provided outside plane directions of these resonators and in which the resonators supported at their center serving as a vibration node vibrate in a direction perpendicular to the plane directions by Coulomb's force.

Disclosed in "Bulk-Acoustic Wave Filters: Performance Optimization and Volume Manufacturing" (Aigner et al., 2003 IEEE MTT-S digest, pp. 2001-2004) is a thin film piezoelectric bulk acoustic wave resonator that uses a Bragg elastic reflection layer as an elastic insulating layer of an FBAR.

SUMMARY OF THE INVENTION

Generally, a thin film piezoelectric bulk acoustic wave resonator having a resonant frequency of 1 MHz or higher suitable for a radio-frequency filter includes a resonance part having an piezoelectric thin film, a first metal thin film, and a second metal thin film, all of which are formed by a thin film apparatus, and acoustic wave reflectors. At least a part of the piezoelectric thin film is interposed between the first and second metal thin films. The first metal thin film serves as an upper electrode. The second metal thin film serves as a lower electrode. The piezoelectric thin film is polarized in its thickness direction. An alternating electric field generated by an alternating voltage applied between the upper and lower electrodes causes an acoustic wave inside the piezoelectric thin film according to piezoelectric/anti-piezoelectric effects. The resonance part including the piezoelectric thin film and the upper and lower electrodes is vertically lo interposed between the acoustic wave reflectors. An interface between a solid and a gas (or vacuum) serves as an efficient acoustic wave reflector.

In an FBAR, excited acoustic waves extend and shrink inside a piezoelectric thin film in thickness directions and propagate in thickness directions. Since the resonance part is vertically interposed between gases (vacuum), the acoustic wave generated inside the piezoelectric thin film is confined inside the resonator.

In a ring resonator, excited acoustic waves extend and shrink inside a piezoelectric thin film patterned into a ring in radial directions and propagate in radial directions. Since the resonance part, except for portions thereof supported by some supporters, is surrounded by a gas (vacuum), the acoustic waves generated within the piezoelectric thin film are confined inside the resonator.

In a RE resonator, excited acoustic waves extend and shrink inside a piezoelectric thin film patterned into a circle in radial directions and propagates in radial directions. Since the resonance part, except for portions thereof supported by some supporters, is surrounded by a gas (vacuum), the acoustic waves generated within the piezoelectric thin film are confined inside the resonator.

The above-mentioned related-art radio-frequency thin film piezoelectric bulk acoustic wave resonators have the following problems.

In the FBAR thin film piezoelectric bulk acoustic wave resonators disclosed in the above-mentioned U.S. Pat. No. 6,617,249 and "Bulk-Acoustic Wave Filters: Performance Optimization and Volume Manufacturing", excited acoustic waves resonate when their halfwavelength matches the sum of the thicknesses of the piezoelectric thin film and the upper and lower electrodes. A resonant frequency is the ratio of the sound velocity and the wavelength (twice the sum of the thicknesses of the piezoelectric thin film and the upper and lower electrodes) of an acoustic wave. The film thicknesses must be controlled with an accuracy similar to the frequency accuracy. This is because a resonant frequency is controlled by the film thicknesses. Therefore, an expensive film making apparatus is required, resulting in an increase in cost.

The ring resonator disclosed in the above "Single-Chip Multiple-Frequency RF Micro resonators Based on Aluminum Nitride Contour-Mode and FBAR Technologies" has an advantage in that the thickness accuracy is relaxed because the frequency is controlled by adjusting the shape. However, the ring resonator is not applicable to a resonator having a wide bandwidth because its bandwidth is narrow.

The RE resonator supporting method disclosed in Japanese Patent Application Laid-Open Publication No. 10-256618 is targeted for resonators that are made of ceramics, a metal, or the like and are on the order of 10 mm in size. Therefore, this method is not applicable to thin film resonators manufactured in a thin film process, which is represented by a semiconductor process, or thin film resonators that are on the order of micrometers in size. This is because a step of manufacturing thin wiring is complicated and costly in the thin film process.

In order to achieve a high Q in a thin film RE resonator, the resonance part is required to be elastically isolated. The wiring disclosed in U.S. Pat. No. 6,617,249 does not hamper elastic isolation of the resonance part because a sufficiently thin conductor is used as the wiring. However, it is difficult to reduce the resistance of such thin wiring in the thin film process. In addition, the process of manufacturing such thin air wiring is complicated and costly. Further, if wiring is not formed so as to be sufficiently thin, such wiring acts as an elastic supporter, resulting in a deterioration of the Q value.

The resonator disclosed in Japanese Patent Application Laid-Open No. 2005-277861 is quite different in configuration and operation principle from a thin film piezoelectric bulk acoustic wave resonator relating to the present invention. Specifically, Coulomb's force that causes the disclosed resonator to vibrate is weaker than a vibration force generated by a piezoelectric material in the resonator by two orders or more of magnitude. Therefore, the disclosed resonator does not obtain a wide bandwidth.

Main subjects to be solved of the present invention are to provide a thin film piezoelectric vibrator, a thin film piezoelectric bulk acoustic wave resonator, and a radio-frequency filter using such a resonator that each allow an improvement of the Q value serving as a resonance characteristic as well as allow a reduction in cost.

According to an aspect of the present invention, a thin film piezoelectric vibrator includes a resonance part having at least one vibration unit, and a supporter that supports the resonance part. The vibration unit comprising a multilayer structure including: a piezoelectric thin film; a first metal electrode film; and a second metal electrode film; wherein at least a part of the piezoelectric thin film is configured to interposed between the first and second metal electrodes, wherein the piezoelectric thin film is polarized in a direction perpendicular to a film surface and vibrates in radial extension mode, and wherein the supporter is connected onto an insulating substrate at a vibration node of the resonance part.

According to the aspect of the present invention, a thin film piezoelectric vibrator, a thin film piezoelectric bulk acoustic wave resonator, and a radio-frequency filter using such a resonator that each allow an improvement of the Q value serving as a resonance characteristic as well as allow a reduction in cost are provided.

BRIEF DESCRIPTION OF THE DRAWINGS

Embodiments of the present invention will be described in detail with reference to the accompanying drawings, wherein.

DETAILED DESCRIPTION OF THE PREFERRED EMBODIMENTS

Support structures of a thin film piezoelectric vibrator and an RE resonator according to the present invention will now be described in detail with reference to some preferred embodiments shown in the accompanying drawings.

The present invention is targeted for RE resonators whose resonant frequency is a radio-frequency of 1 MHz or higher and is determined according to the width or diameter of their resonance part.

The thin film forming apparatus mentioned in this specification is an apparatus, such as a sputtering apparatus, a vapor deposition apparatus, or a chemical vapor deposition apparatus, that forms films by depositing molecules, atoms, ions, or clusters thereof directly on a substrate, or by doing so while causing a chemical reaction. The thin film mentioned in this specification is a film formed by such a thin film forming apparatus and such thin films do not include sintered compacts created by sintering or bulk materials formed by the hydrothermal synthesis method, the Czochralski method, or the like, regardless of the thickness thereof.

First Embodiment

Figure 1:
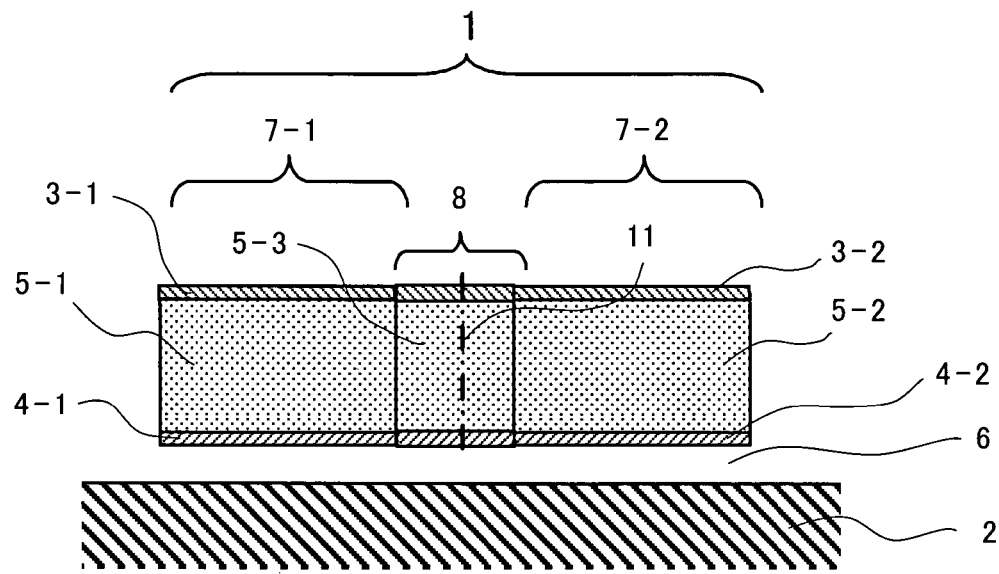
FIG. 1 is schematic longitudinal sectional view of a thin film RE resonator according to a first embodiment of the present invention and shows a section taken along line I-I of FIG. 3.
Figure 2:
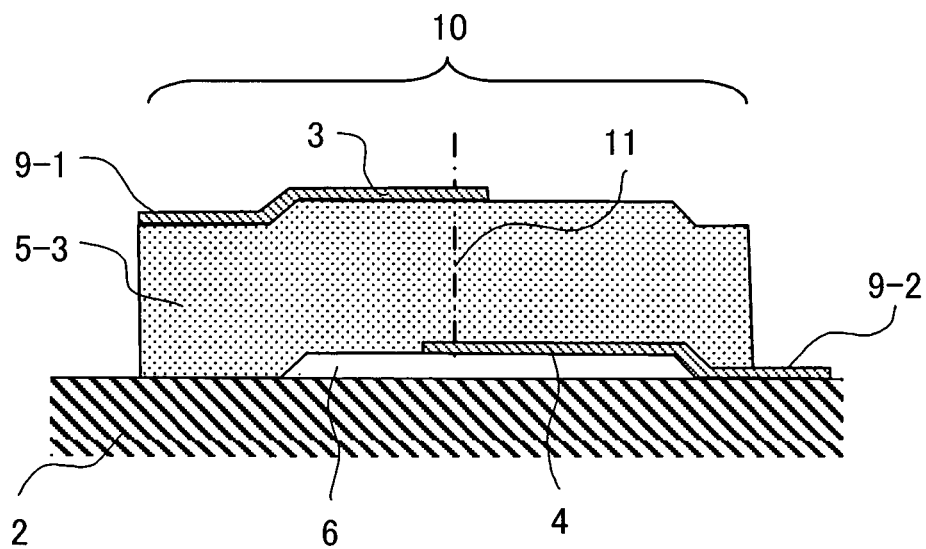
FIG. 2 is a schematic longitudinal sectional view of the thin film RE resonator according to the first embodiment and shows a section taken along line I'-I' of FIG. 3.

Referring now to FIGS. 1 to 10, a thin film piezoelectric vibrator and a thin film RE resonator according to a first embodiment will be described. First, configurations of the thin film piezoelectric vibrator and the thin film RE resonator according to the first embodiment will be described with reference to FIGS. 1 to 3B. FIGS. 1 and 2 are schematic longitudinal sectional views of the thin film RE resonator according to the first embodiment. FIG. 3A is a schematic plan view of the thin film RE resonator according to the first embodiment. FIG. 3B is a drawing showing the relation between the width of a connection part and the width of a resonance part. FIG. 1 shows a section taken along line I-I of FIG. 3A, and FIG. 2 shows a section taken along line I'-I' of FIG. 3A.

A thin film RE resonator 1 is formed on an insulating substrate 2. A resonance part (thin film piezoelectric vibrator) 7 has a multilayer structure including a piezoelectric material (piezoelectric thin film) 5, a pair of upper electrodes 3, and a pair of lower electrodes 4. At least a part of the piezoelectric material 5 is interposed between the upper electrodes 3 and the lower electrodes 4. A gap 6 is provided between the lower electrode 4 and the insulating substrate 2.

The pair of upper electrodes 3 (3-1, 3-2) face the corresponding pair of lower electrodes 4 (4-1, 4-2) with the piezoelectric material 5 therebetween.

The upper electrode 3 and the lower electrode 4 are both formed of a molybdenum film that is fabricated by deposition, for example, by a thin film forming apparatus and has a plan shape of a circle. The piezoelectric material 5 is formed of a circular C axis orientation aluminum nitride film (whose polarization direction is perpendicular to a surface thereof).

Figure 3A:
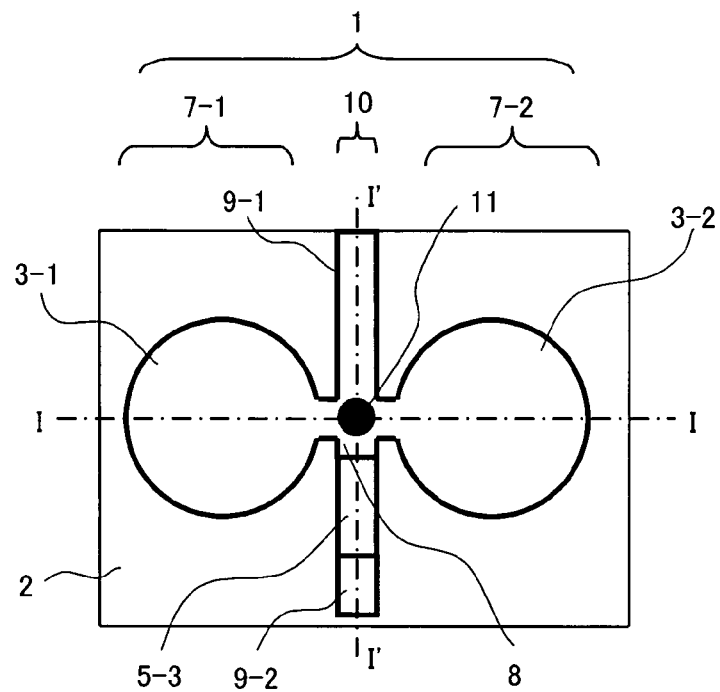
FIG. 3A is a schematic plan view of the thin film RE resonator according to the first embodiment.
Figure 3B:
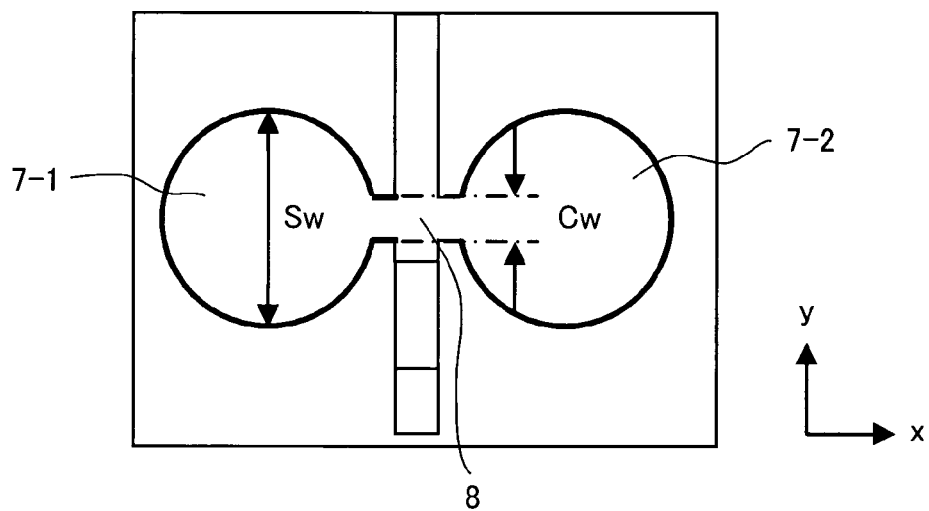
FIG. 3B is a drawing showing a relation between the width of a connection part and that of a resonance part of the first embodiment.

Thus, two vibration units (7-1, 7-2) having an identical shape, one connection part 8 (3, 4, 5-3) for connecting these vibration units electrically in direct current and elastically (mechanically), and a supporter 10 connected to the center of the connection part 8 constitute one resonance part (thin film piezoelectric vibrator) 7. A vibration node of the resonance part is represented by a reference numeral 11. As shown in FIG. 3B, the connection part 8 has a plan shape of a rectangle having a width Cw smaller than a width Sw of the resonance part 7, that is, a diameter thereof.

The upper electrode 3 includes a region constituting a set of upper electrodes (3-1, 3-2) and a region constituting a part of the connection part 8. However, these regions are functional partitions and the entire upper electrode 3 is integrally formed of an identical material, such as by depositing such a material (the same goes for other embodiments). The lower electrode 4 includes a region constituting a set of lower electrodes (4-1, 4-2) and a region constituting a part of the connection part 8. However, these regions are functional partitions and the entire lower electrode 4 is integrally formed of an identical material.

The piezoelectric material 5 is also segmented into regions 5-1, 5-2 interposed between the pair of upper electrodes 3 and the pair of lower electrodes 4 and serving as vibrators, and a region (5-3) interposed between these regions and serving as a part of the connection part 8. However, all these regions are functional partitions and the entire piezoelectric material 5 is integrally formed of an identical material (the same goes for other embodiments).

The resonance part 7 vibrates in radial extension mode with a center of the piezoelectric thin film used as a node and the piezoelectric thin films in the two vibration units (7-1, 7-2) are polarized in a direction perpendicular to a film surface thereof.

In this embodiment, the center of the connection part 8 matches the vibration node 11. In other words, the two vibration units (7-1, 7-2) having an identical shape and the single connection part 8 are made up of the piezoelectric material 5, the upper electrode 3, and the lower electrode 4. The upper electrode 3-1 and 3-2 are electrically connected in direct current to each other via an upper electrode in the connection part 8. The lower electrode 4-1 and 4-2 are also electrically connected in direct current to each other via a lower electrode in the connection part 8. The supporter 10 is configured to hold the two vibration units at the center of the connection part 8, that is, at the vibration node 11. The upper electrode 3 constituting the front side of the connection part 8 and the lower electrode 4 constituting the back side thereof are electrically in direct current connected to terminals 9-1, 9-2, respectively, via two drawing lines (extensions of the upper electrode 3 and the lower electrode 4) extending in directions perpendicular to a line linking the pair of upper electrodes 3-1 and 3-2.

In this embodiment, the two vibration units are symmetrical with respect to the connection part 8. In each vibration unit, the upper electrode 3, the lower electrode 4, and the piezoelectric material 5 all have an identical plan shape. In other words, each vibration unit (7-1, 7-2) has the plan shape of a circle having an identical radius, and the connection part 8 has the plan shape of a rectangle having a width smaller than the width of each vibration unit, that is, the diameter thereof.

However, if the two vibration units are symmetrical, the two upper electrodes 3 are electrically connected in direct current to each other, the two lower electrodes 4 are electrically connected in direct current to each other, the electrodes 3 and 4 constituting the front side and back side, respectively, of the connection part 8 also serve as electrical drawing lines, and the width of the supporter is smaller than that of the resonance part in a plan view, then the upper electrode 3, the lower electrode 4, and the piezoelectric material 5 need not always have a completely identical plan shape.

The plan shape of the resonance part may be a regular polygon, such as a square, a regular pentagon, or a regular hexagon, or may be a rectangle.

The upper electrode 3 and the lower electrode 4 may be made of other conductive materials, such as Cu and Al. The piezoelectric material 5 may be formed of other piezoelectric thin films made of zinc oxide, tantalum pentoxide, or the like.

Figure 4:
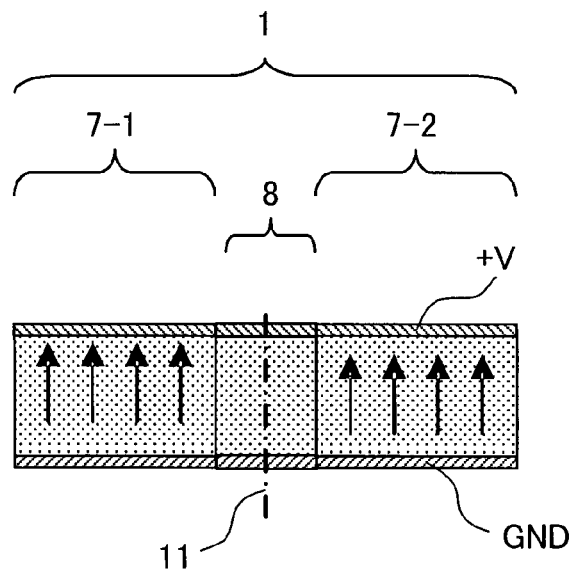
FIG. 4 is a schematic longitudinal sectional view (when a voltage of +V is applied) showing an operation of the thin film RE resonator according to the first embodiment.
Figure 5:
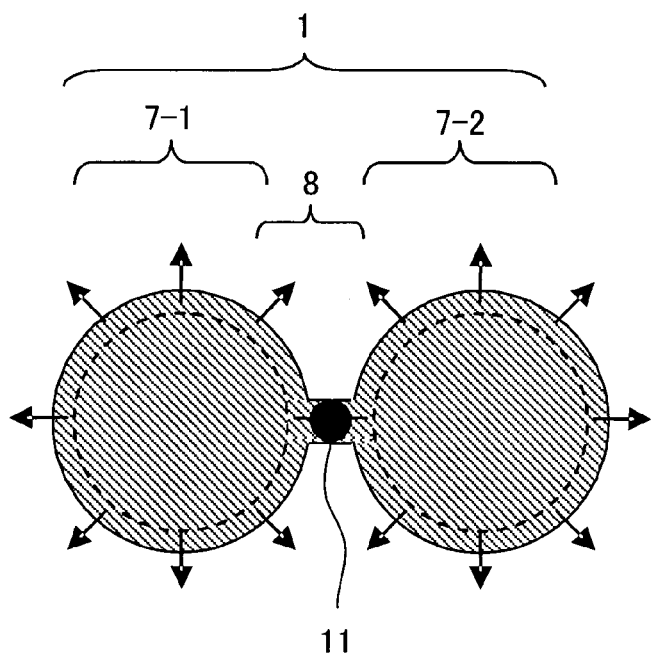
FIG. 5 is a schematic plan view (when +V is applied) showing an operation of the thin film RE resonator according to the first embodiment.
Figure 6A:
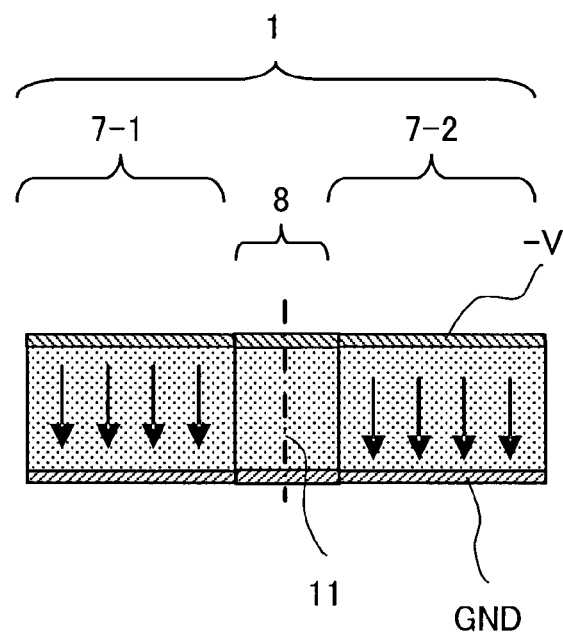
FIG. 6A is a schematic longitudinal sectional view (when −V is applied) showing an operation of the thin film RE resonator according to the first embodiment.
Figure 6B:
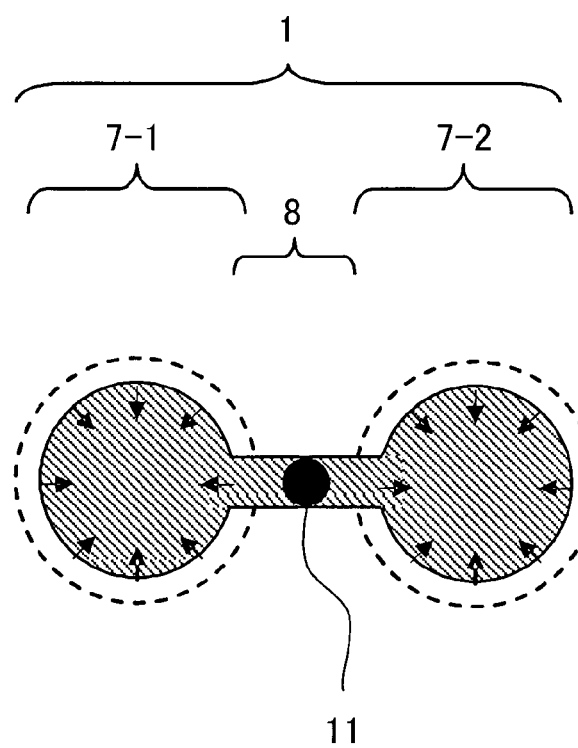
FIG. 6B is a schematic plan view (when −V is applied) showing an operation of the thin film RE resonator according to the first embodiment.

FIGS. 4 to 6 are schematic diagrams showing functions of the resonance part 7 and the connection part 8 according to the present invention. An alternating electric signal is applied between two drawing lines provided on the front and back sides of the supporter 10 (not shown in FIGS. 4 to 6). Assume that an alternating current from +V to −V is applied to one of the drawing lines and 0 V (ground) is applied to the other. FIGS. 4 and 5 show a state in which a voltage of +V is applied to the upper electrode 3, while FIGS. 6A and 6B show a state in which a voltage of −V is applied to the upper electrode 3.

As apparent from these diagrams, the orientations of electric fields in the two vibration units (7-1, 7-2) interposed between the upper electrodes 3 and the lower electrodes 4 are always the same. Therefore, the vibration units automatically vibrate in phase. As a result, the vibration node 11 occurs at the center of the connection part 8, and the supporter 10 provided at the center of the connection part 8 serves as an ideal, rigid supporter.

In the first embodiment, the two vibration units that are symmetrical with respect to the connection part 8 are connected to each other electrically and elastically, and the supporter 10 provided at the vibration node 11 that occurs at the center of the connection part 8 is connected to the terminals 9-1 and 9-2 via the drawing lines. Therefore, the positions in which the drawing lines are connected to the supporter are considered as accurate vibration nodes. In addition, since there are no drawing lines that are directly connected to the vibration units (and, therefore, act as elastic supporters), leakage of elastic energy that causes a deterioration of the Q value is prevented (that is, the supporter serves as an ideal, rigid supporter).

Further, electrically connecting the two vibration units eliminates the need for providing air wiring. This realizes a thin film piezoelectric bulk acoustic wave radio-frequency resonator that is low-cost and has a high Q value.

Figure 7:
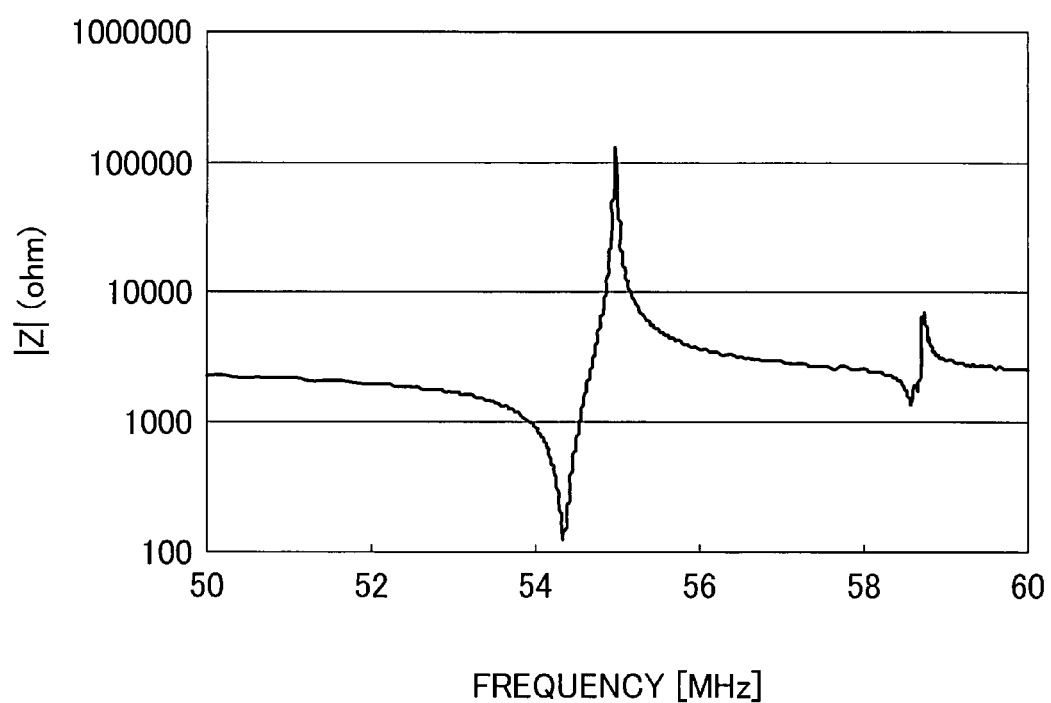
FIG. 7 is a graph showing an impedance characteristic of the resonator according to the first embodiment.

FIG. 7 shows the impedance characteristic of the resonator according to the first embodiment. Assume that the diameter of each resonance part is 100 μm, the width of the connection part is 10 μm, the width of the piezoelectric material (AiN) is 1.3 μm, and the thicknesses of the upper and lower electrodes (Mo) are both 0.3 μm. From this graph, it is understood that according to the configuration of this embodiment, a resonator that has a wide bandwidth of 1.1% and a high Q of 2000 is realized.

FIGS. 8A to 8E outline an example of the manufacturing process of the resonator according to the first embodiment.

Figure 8A:
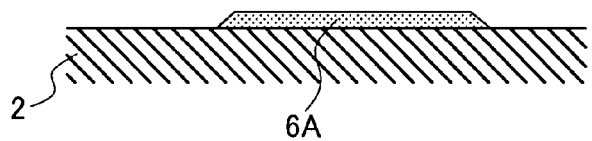
FIG. 8A is a sectional view showing the manufacturing process of the first embodiment.
Figure 8B:
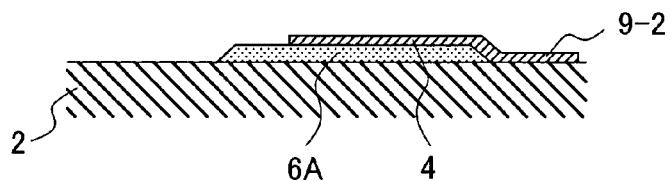
FIG. 8B is a sectional view showing the manufacturing process of the first embodiment.
Figure 8C:
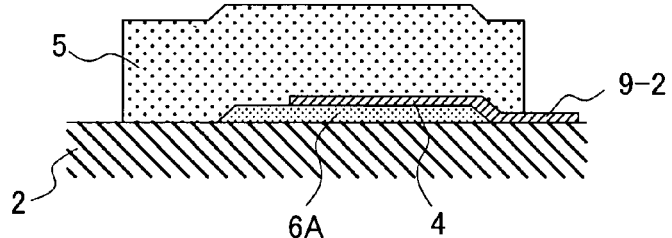
FIG. 8C is a sectional view showing the manufacturing process of the first embodiment.
Figure 8D:
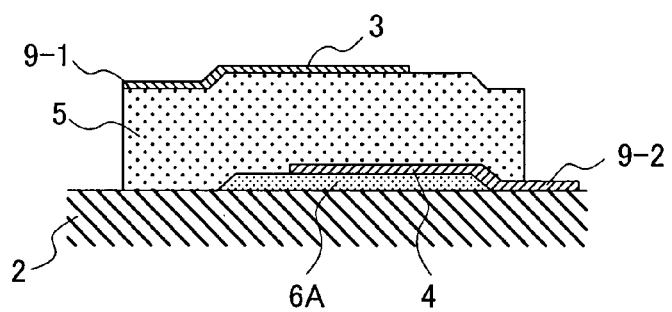
FIG. 8D is a sectional view showing the manufacturing process of the first embodiment.
Figure 8E:
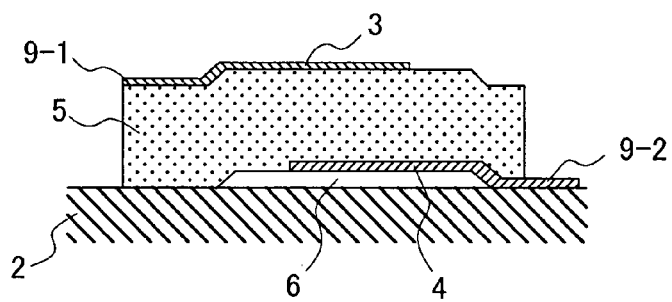
FIG. 8E is a sectional view showing the manufacturing process of the first embodiment.

A material is deposited and patterned to form a projecting sacrifice layer 6A on the insulating substrate 2 (FIG. 8A). Then, a material is deposited and patterned to form the lower electrode 4 and the terminal 9-2 (FIG. 8B). Then, a material is deposited and patterned to form the piezoelectric thin film 5 (FIG. 8C), and then a material is deposited and patterned to form the upper electrode 3 and the terminal 9-1 (FIG. 8D). Finally, the sacrifice layer 6A is eliminated to provide the gap 6. Thus, the resonance part 7 is formed (FIG. 8E).

Apparatuses for forming films include sputtering apparatuses, vapor deposition apparatuses, and chemical vapor deposition apparatuses. Among apparatuses for pattering is plasma etching apparatuses.

The resonant frequencies are adjusted by adjusting the diameters of the two vibration units in the photomask and exposure steps of each film forming process. The difference in resonant frequency is controlled by adjusting a size in-place directions. This allows a low-cost thin film bulk acoustic wave resonator to be provided without requiring an expensive film forming apparatus. This also allows the stopband of a filter using such a thin film bulk acoustic wave resonator to be widen without increasing the number of steps.

Since the connection part 8 includes the piezoelectric material 5 (5-3) and the electrodes 3 and 4 provided on the upper and lower surfaces of the piezoelectric material 5, spurious mode occurs in the connection part 8, independently of RE mode. To suppress such spurious mode, the width of the connection part 8 must be smaller, preferably, one-fourth or less, than that of the resonance part 7. This will be described with reference to FIG. 9.

Figure 9A:
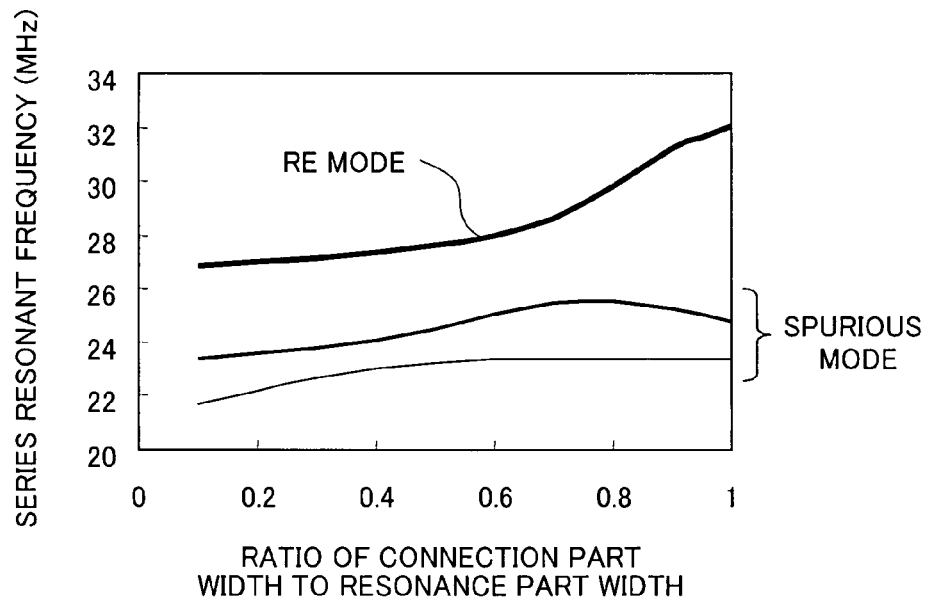
FIG. 9A is a graph showing the relation between the ratio of the connection part width to the resonance part width and the resonant frequency of the first embodiment.
Figure 9B:
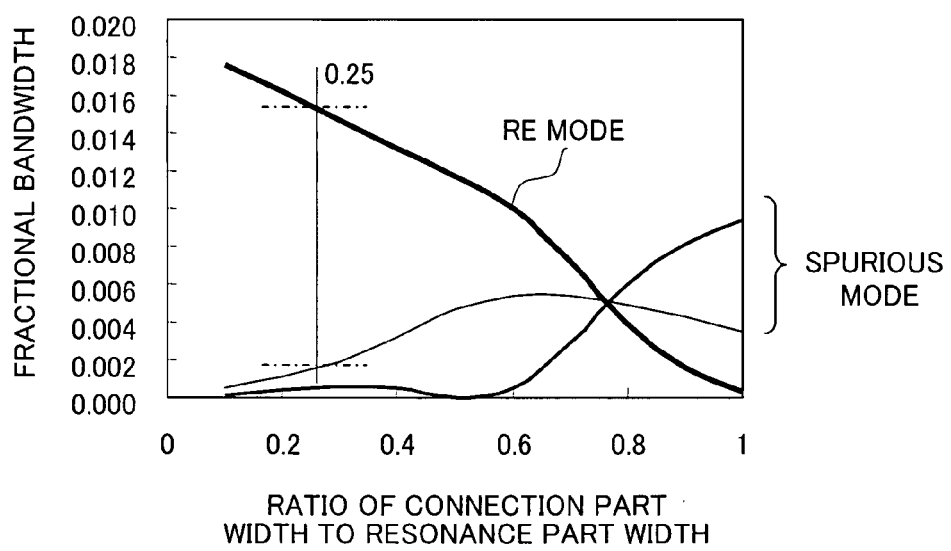
FIG. 9B is a graph showing the relation between the ratio of the connection part width to the resonance part width and the fractional bandwidth of the first embodiment.

FIGS. 9A and 9B show the dependences of spurious mode on the ratio of the connection part width to the resonance part width of the first embodiment. FIG. 9A is a graph showing the relation between the ratio of the connection part width to the resonance part width and the resonant frequency. FIG. 9B is a graph showing the relation between the ratio of the connection part width to the resonance part width and the fractional bandwidth.

As an example, assume that the plan shape of the resonance part 7 is a square with each side of 200 μm (width 200 μm), the length and width of the connection part 8 are 40 μm and 20 to 200 μm, respectively, and the thicknesses of the connection part 7 and the connection part 8 are both 1 μm.

As shown in FIG. 9A, two spurious modes (22 to 26 MHz) occur on the low frequency side of RE mode (principal vibration: 28 to 32 MHz). Such spurious modes whose frequencies are close to that of RE mode must be reduced to one-tenth or less of the principal vibration.

FIG. 9B shows the relation between the fractional bandwidth df (longitudinal axis) and the ratio (transverse axis) of the connection part width to the resonance part width, as an indicator of the excitation intensities of RE mode and spurious mode. The fractional bandwidth df is determined by the following equation.

$$df=(fa-fr)/fa \qquad \text{Equation 1}$$

where fr is a series resonant frequency and fa is a parallel resonant frequency. As apparent from the graph, a larger ratio of the connection part width to the resonance part width, in other words, a larger width of the connection part 8 reduces the fractional bandwidth of RE mode and increases that of spurious mode. Therefore, the width of the connection part 8 is preferably smaller than that of the resonance part 7 in a plan view. From FIG. 9B, it is understood that the width of the connection part 8 is preferably one-fourth or less of that of the resonance part 7 in order to reduce spurious mode to one-tenth or less of the principal vibration.

It is also understood that the fractional bandwidth of RE mode at this time becomes a wide bandwidth of 0.015 or more.

In the above example, it is assumed that the vibration unit has the plan shape of a square. If the vibration unit has the plan shape is a circle, it is apparent that the width of the connection part is preferably one-fourth or less of that of the resonance part, that is, the diameter thereof. The width of the connection part 8 may be minimized inasmuch as the entire connection part 8 including the thickness thereof connects the two vibration units without causing substantial electrical resistance and inasmuch as the connection part 8 is an elastic material having mechanical strength with which the connection part 8 withstands vibrations.

Figure 10A:
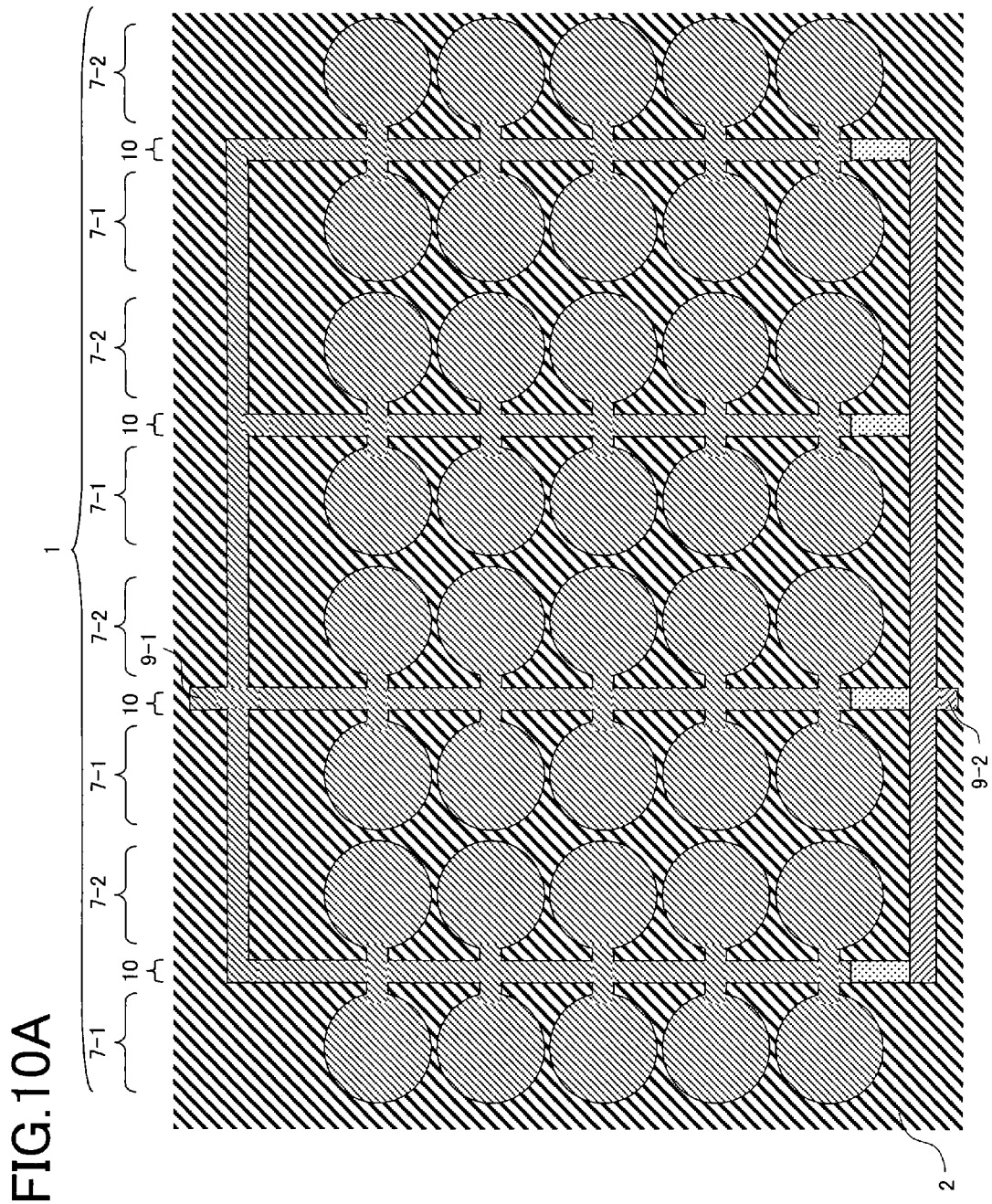
FIG. 10A is a plan schematic view showing a thin film RE resonator including 40 vibration units as an aspect of the first embodiment.

FIG. 10A shows an example configuration of a low-impedance thin film RE resonator according to this embodiment. In this thin film RE resonator, the impedance between the terminals 9-1 and 9-2 is adjusted using the thickness of the piezoelectric material 5. In other words, use of a thin piezoelectric material realizes a low-impedance resonator. However, if an aluminum nitride piezoelectric thin film is thinned down to the order of 100 nm, a phenomenon in which the orientation of the polarization axis is deteriorated and the piezoelectric effect is weakened occurs. In this case, connecting a great number of thin film RE vibration units in parallel realizes one low-impedance resonator. In FIG. 10, a total of 40 vibration units are provided to 4 supporters 10 so as to realize one low-impedance resonator. Since the diameters of all the vibration units are equal in size, one low-impedance resonator is observed by measuring an electrical characteristic between the terminals 9-1 and 9-2.

Note that all the vibration units need not always have the same diameters. Configuring a resonator using vibration units having different diameters and connecting such vibration units to an input and an output in parallel realizes a resonator that has an advantage similar to that of a sixth embodiment to be discussed later despite being a single resonator. However, in this case, in order for the center of the connection part to serve as a vibration node, vibration units connected by a connection part must have the same diameter.

Figure 10B:
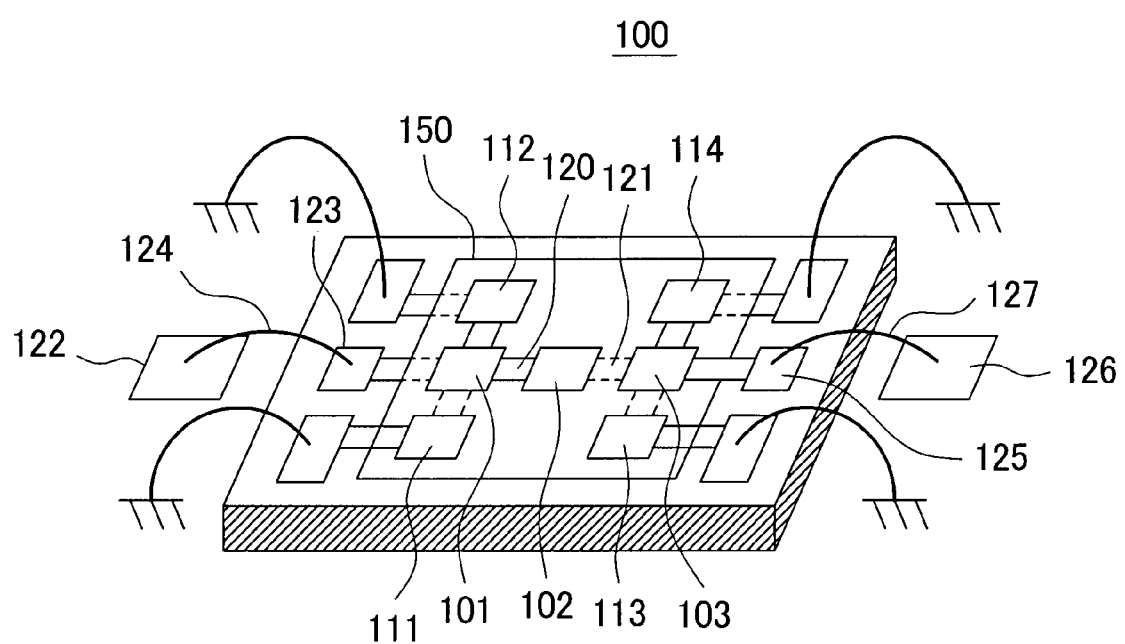
FIG. 10B is a perspective view of a radio-frequency filter for transmission adopting thin film piezoelectric acoustic wave resonators according to the first embodiment tin and schematically shows an example in which such a filter is formed on a single substrate.

FIG. 10B is a perspective view of a radio-frequency filter that adopts the thin film piezoelectric acoustic wave resonators according to the first embodiment and is used for transmission in a cellular phone, and schematically shows an example in which such a filter is formed on a single substrate.

A radio-frequency filter 100 includes thin film piezoelectric bulk acoustic wave resonators 101 to 103 serving as series resonators and thin film piezoelectric bulk acoustic wave resonators 111 to 114 serving as parallel resonators. The upper electrode 3 and the lower electrode 4 of each resonator are provided with drawing lines 120 and 121, respectively, so that the resonators 101 to 114 are connected to each other via these drawing lines. An input wiring pad 122 to which transmission signals are sent is connected to an input pad 123 of the filter via a bonding wire 124. The input pad 123 and the lower electrode of the resonator 101 serving as a series resonator are connected to each other via a drawing line. The upper electrode of the resonator 103 serving as a series resonator is connected to an output pad 125 of the filter via a drawing line. A output wiring pad 126 that is connected to an antenna is connected to the output pad 125 via a bonding wire 127. The upper electrodes of the resonators 111 and 113 serving as parallel resonators and the lower electrodes of the resonators 112 and 114 serving as parallel resonators are grounded via bonding wires.

The resonant frequencies are adjusted by adjusting the diameters of two vibration units in the photomask and exposure steps of each film forming process. This realizes the radio-frequency filter 100 that includes multiple thin film piezoelectric bulk acoustic wave resonators having different resonant frequencies obtained in the film forming step without increasing the number of steps.

As described above, according to this embodiment, use of RE mode as the principal vibration component realizes a thin film vibrator having a wide-band resonance characteristic. Specifically, a vibration node is located at the center of the connection part for connecting a pair of vibration units and the supporter is formed at the node. Therefore, the supporter serves as an ideal, rigid supporter. Connecting the drawing lines to the center of the connection part 8 prevents leakage of elastic energy that causes a deterioration of the Q value. This realizes a high Q.

Further, the stopband of the filter using the thin film piezoelectric acoustic wave resonator is made wider. In particular, making the width of the connection part one-fourth or less of that of the resonance part allows spurious mode to be reduced to one-tenth or less of the principal vibration, thereby widening the fractional bandwidth of RE mode.

Further, according to this embodiment, the difference in resonant frequency is controlled by adjusting a size in plane-directions. For example, resonant frequencies are fine-tuned by adjusting the diameters of the two vibration units in the photomask and exposure steps. As a result, a low-cost thin film piezoelectric bulk acoustic wave resonator is provided without requiring an expensive film forming apparatus.

Second Embodiment

Figure 11:
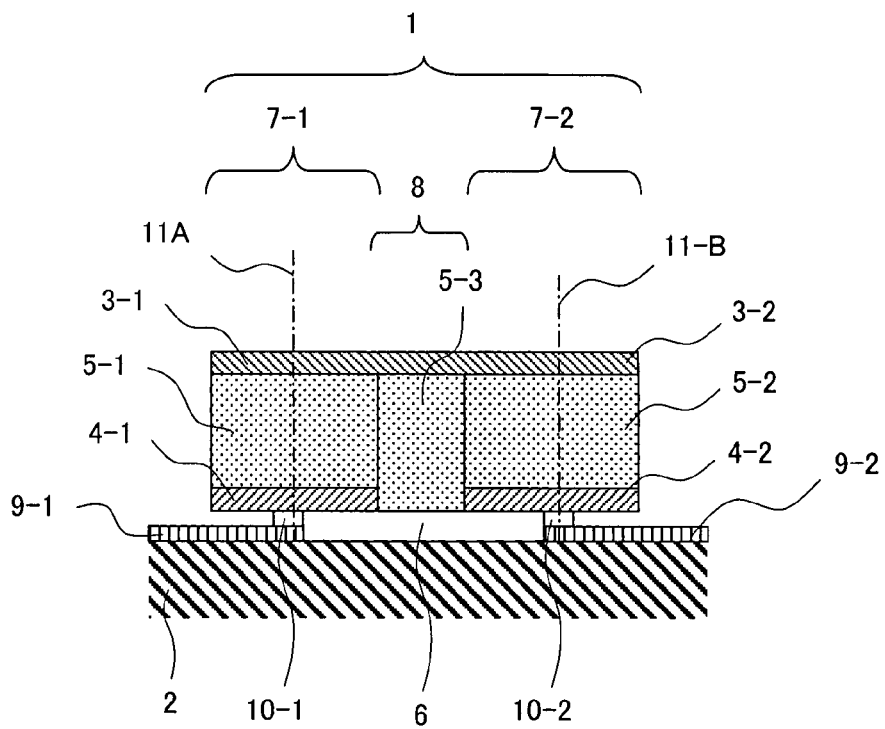
FIG. 11 is a schematic longitudinal sectional view of a thin film RE resonator according to a second embodiment of the present invention and shows a section taken along line I-I of FIG. 12.
Figure 12:
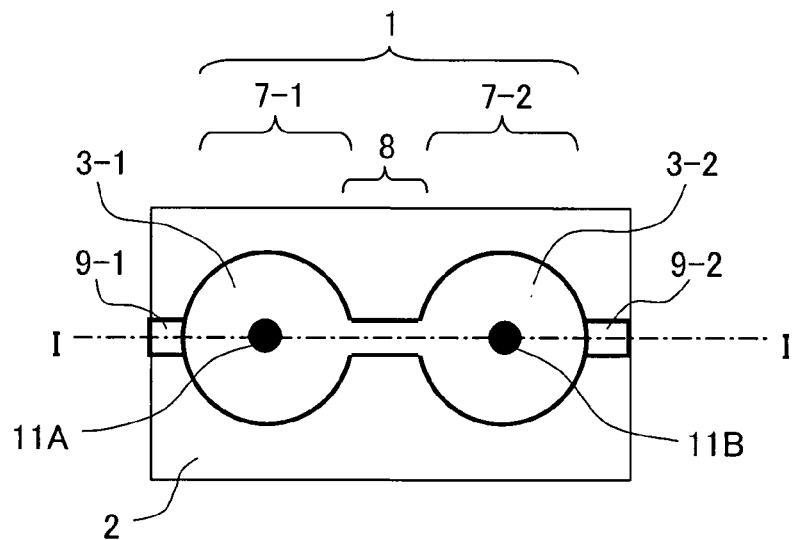
FIG. 12 is a schematic plan view of the thin film RE resonator according to the second embodiment.
Figure 13:
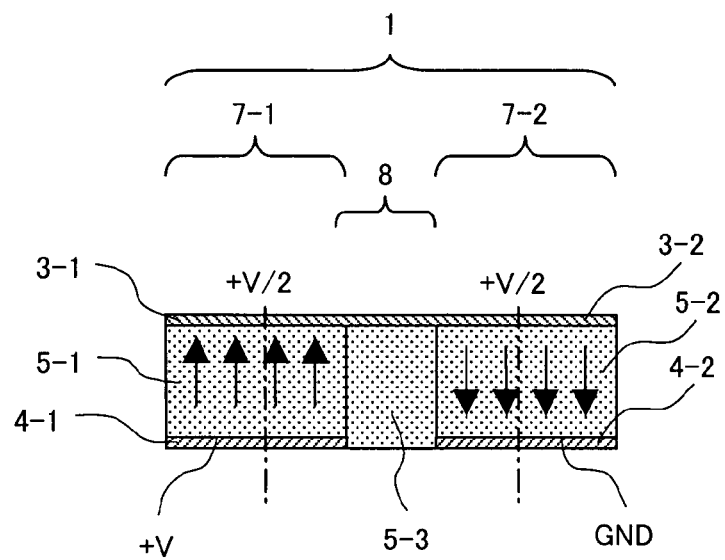
FIG. 13 is a schematic longitudinal sectional view (when +V is applied) showing an operation of the thin film RE resonator according to the second embodiment.
Figure 14:
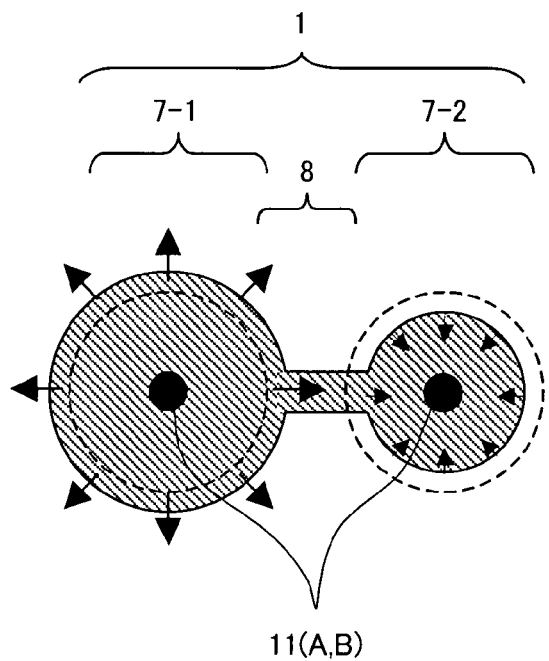
FIG. 14 is a schematic plan view (when +V is applied) showing an operation of the thin film RE resonator according to the second embodiment.
Figure 15:
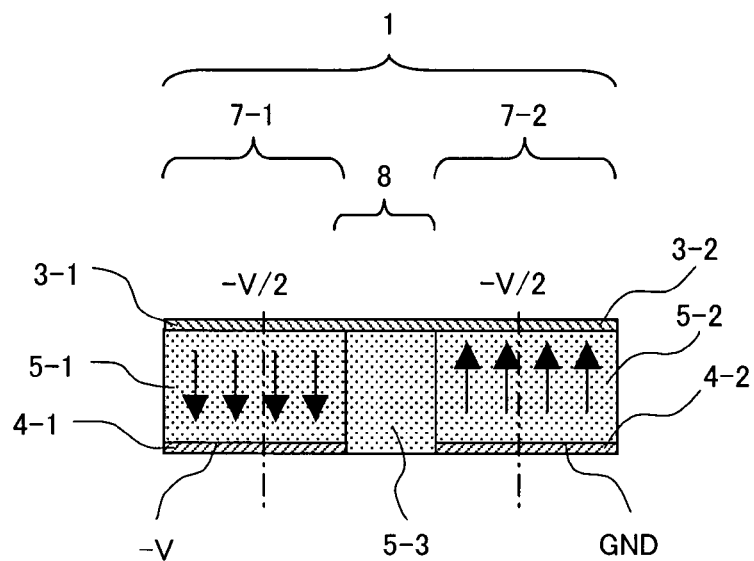
FIG. 15 is a schematic longitudinal sectional view (when −V is applied) showing an operation of the thin film RE resonator according to the second embodiment.
Figure 16:
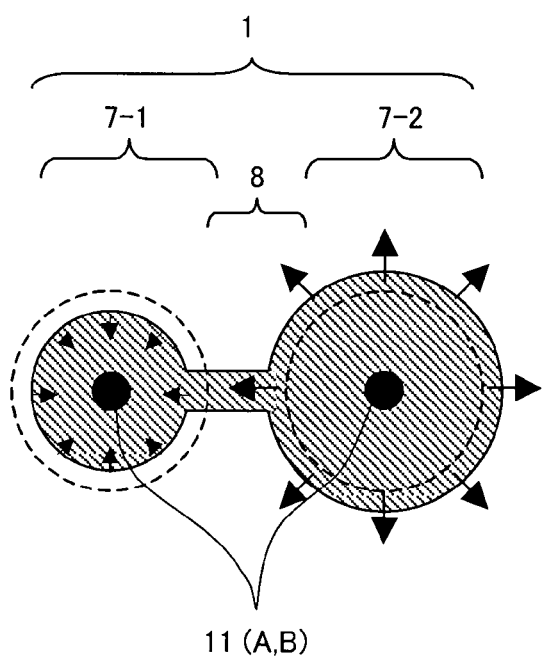
FIG. 16 is a schematic plan view (when −V is applied) showing an operation of the thin film RE resonator according to the second embodiment.

Referring now to FIGS. 11 and 12, a thin film RE resonator according to a second embodiment of the present invention will be described. FIG. 11 is a schematic sectional view of the thin film RE resonator according to the second embodiment and shows a section taken along line I-I of FIG. 12. FIG. 12 is a schematic plan view of the thin film RE resonator according to the second embodiment.

A thin film RE resonator 1 is formed on an insulating substrate 2. Two vibration units (7-1, 7-2) constituting a resonance part 7 of the thin film RE resonator 1 each have a multilayer structure including a piezoelectric material (piezoelectric thin film) 5 (5-1, 5-2), a pair of upper electrodes (first metal electrode film) 3 (3-1, 3-2), and a pair of lower electrodes (second metal electrode film) 4 (4-1, 4-2). At least a part of the piezoelectric material 5 is interposed between the upper electrodes 3 and the lower electrodes 4.

In this embodiment, the upper electrode 3 and the lower electrode 4 are both formed of a molybdenum film having a circular plan shape. The piezoelectric material 5 is formed of a circular C axis orientation aluminum nitride film (whose polarization direction is perpendicular to a film surface).

The upper electrode 3 and the lower electrode 4 may be made of other conductive materials, such as Cu and Al. The piezoelectric material 5 may be formed of other piezoelectric thin films made of zinc oxide, tantalum pentoxide, or the like. The plan shape of the resonance part may be a regular polygon, such as a square, a regular pentagon, or a regular hexagon, or may be a rectangle.

The upper electrode 3 faces the corresponding lower electrode 4 with the piezoelectric material 5 therebetween. The thin film RE resonator 1 includes two vibration units 7 each having an identical shape, a connection part 8 (3, 5-3) for connecting these vibration units electrically (mechanically) and elastically, and two supporters 10 (10-1, 10-2) located at the centers of the lower electrodes 4.

A gap 6 that is an air gap, except for the supporter 10, between the lower electrode 4 and the insulating substrate 2 serves as an elastic insulating layer.

The two supporters 10 also serve as electrical drawing lines. The lower electrodes 4-1 and 4-2 are connected to terminals 9 (9-1 and 9-2) via the drawing lines. The upper electrodes 3-1 and 3-2 are electrically connected to each other via the connection part and serve as one floating electrode. The two vibration units 7-1 and 7-2 are symmetrical with respect to the connection part 8. In each resonance part, the upper electrode 3, the lower electrode 4, and piezoelectric material 5 have an identical plan shape.

However, if the two vibration units 7 are symmetrical, the two upper electrodes 3 are electrically connected to each other and serve as a floating electrode, and the supporters 10 are provided at the centers of the lower electrodes 4-1 and 4-2 and also serve as electrical drawing lines, then the upper electrode 3, the lower electrode 4, and the piezoelectric material 5 need not always have an identical plan shape in each vibration unit.

In order to suppress spurious mode, the width of the connection part 8 is preferably one-fourth or less of that of the resonance part 7, as with the first embodiment.

FIGS. 13 to 16 are schematic diagrams showing operations of the resonator according to this embodiment, particularly, those of the upper electrode 3. An alternating electric signal is applied between the two drawing lines (10-1, 10-2) connected to the lower electrodes 4 of the two vibration units. Assume that an alternating current from +V to −V is applied to one of the drawing lines and 0 V (ground) is applied to the other. The lower electrode 4-1 and the upper electrode 3-1 are electrically connected to each other in terms of the capacity. The upper electrode 3-2 and the lower electrode 4-2 are also electrically connected to each other with an identical capacity.

As a result, the potentials of the upper electrodes 3 becomes the intermediate value (between +V/2 and −V/2) between the potentials of the two lower electrodes 4. Electric fields in the two vibration units 7 interposed between the upper electrodes 3 and the lower electrodes 4 have opposite orientations, so the two vibration units 7-1 and 7-2 automatically vibrate in opposite phases. A reference numeral 11 (11A and 11B) represents a vibration node. As a result, no elastic strain occurs in the connection part 8 and therefore the two vibration units 7-1, 7-2 vibrate in pure RE mode and each node 11 precisely match the center of each of the lower electrodes 4 (4-1, 4-2).

In the second embodiment, the upper electrodes 3 of the two vibration units 7 are electrically connected to each other so as to serve as a floating electrode. Therefore, there is no need for providing a drawing line of the upper electrode 3 and the drawing lines of the lower electrodes 4 serve as accurate nodes. This prevents leakage of elastic energy that causes a deterioration of the Q value (the supporter 10 serves as an ideal, rigid supporter). Further, since the two vibration units 7 are electrically connected, no air wiring need be provided. This realizes a thin film piezoelectric bulk acoustic wave radio-frequency resonator that is low-cost and has a high Q value and a wide bandwidth.

The insulating substrate 2 is formed of an insulating material such as a glass substrate, a chemical compound semiconductor substrate, a high-resistance silicon substrate, or a piezoelectric substrate. The insulating substrate 2 may be a semiconductor substrate, a semi-insulator substrate, or a conductor substrate whose surface is covered with an insulating film made of silicon oxide or the like.

While the gap 6 is used as an elastic insulating layer in this embodiment, a similar advantage is obtained even if the Bragg elastic reflection layer disclosed in the above-mentioned "Bulk-Acoustic Wave Filters: Performance Optimization and Volume Manufacturing" is used instead of such a gap. RE mode is mode-converted into transverse waves in the Bragg reflection layer. Therefore, unlike in the above-mentioned "Bulk-Acoustic Wave Filters: Performance Optimization and Volume Manufacturing," in which an FBAR resonator is used, the highest Q value is realized by setting thicknesses of the films in the Bragg reflection layer to one-fourth wavelength of a transverse wave. Further, since the vibration unit is elastically connected to the Bragg reflection layer, there is no need for providing a gap and the supporter can be formed on the entire surfaces of the lower electrodes 4. This realizes a thin film piezoelectric bulk acoustic wave radio-frequency resonator that is low-cost and has a high Q value and a wide bandwidth.

According to this embodiment, a vibration node is located at the center of each of the lower electrodes 4 (4-1, 4-2) included in a pair of vibration units and a supporter is formed at each node. Therefore, the supporters serve as ideal, rigid supporters. Connecting the drawing lines to the vibration nodes prevents leakage of elastic energy that causes a deterioration of the Q value, thereby realizing a high Q.

Further, the stopband of the filter using the thin film piezoelectric bulk acoustic wave resonators is made wider. In particular, setting the width of the connection part to one-fourth or less of that of the resonance part reduces spurious mode to one-tenth or less of the principal vibration as well as increases the fractional bandwidth of RE mode. Further, a low-cost thin film piezoelectric bulk acoustic wave resonator is provided without requiring an expensive film forming apparatus.

Third Embodiment

Figure 17:
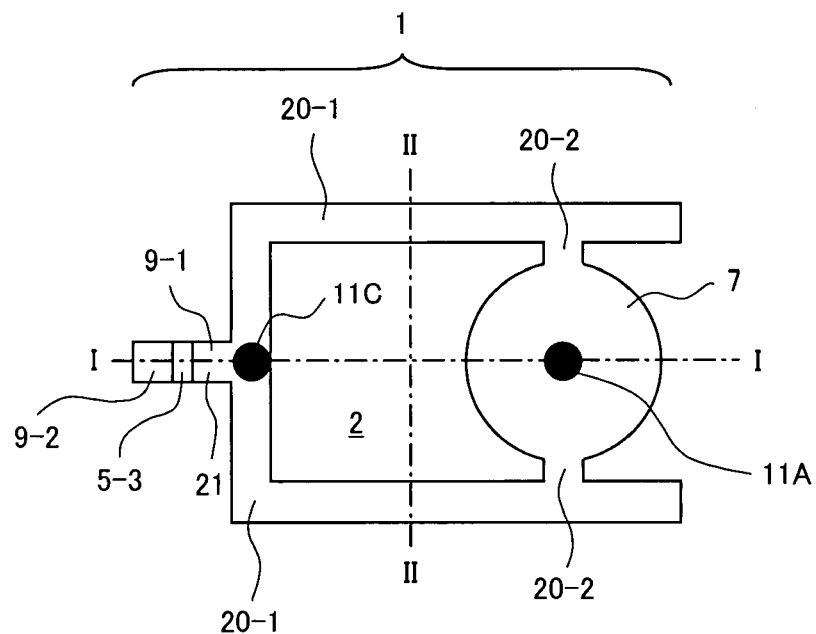
FIG. 17 is a schematic plan view of a thin film RE resonator according to a third embodiment of the present invention.
Figure 18A:
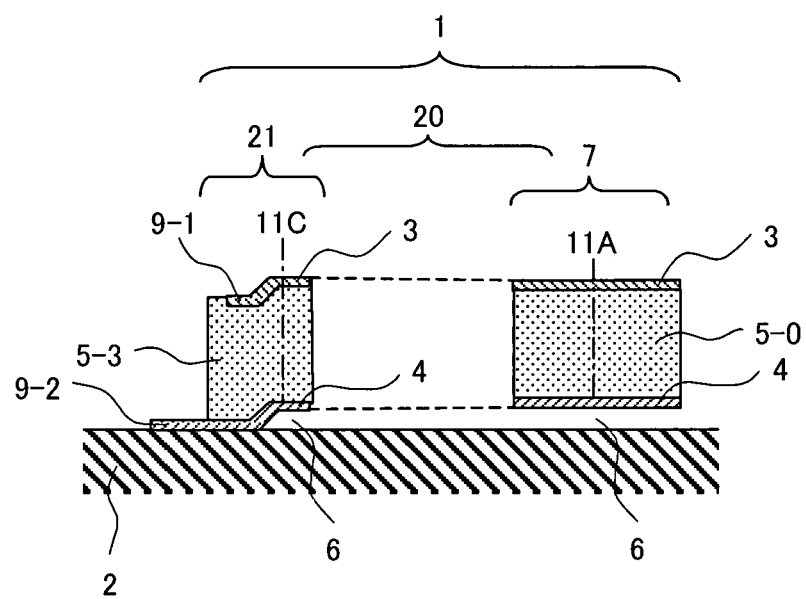
FIG. 18A is a schematic longitudinal sectional view of the thin film RE resonator according to the third embodiment and shows a section taken along line I-I of FIG. 17.
Figure 18B:
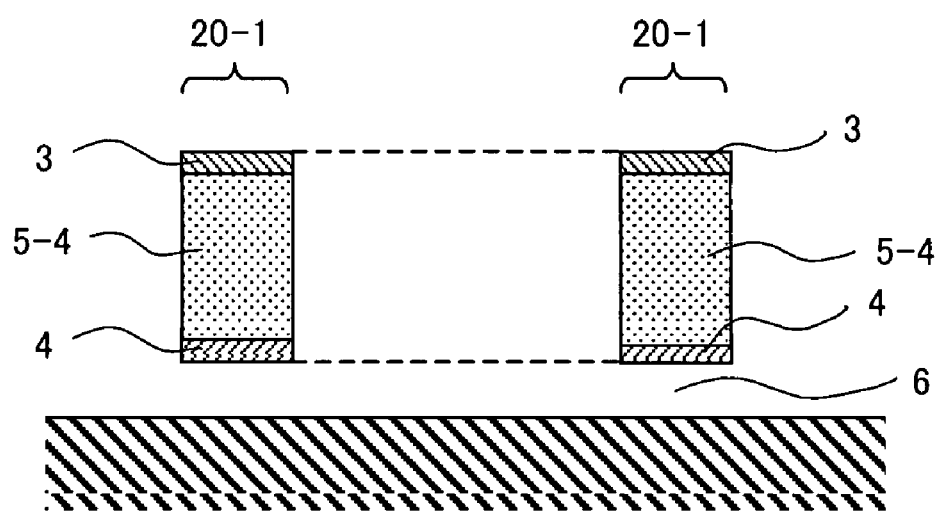
FIG. 18B is a schematic longitudinal sectional view of the thin film RE resonator according to the third embodiment and shows a section taken along line II-II of FIG. 17.

Referring now to FIGS. 17 and 18, a thin film RE resonator according to a third embodiment of the present invention will be described. FIG. 17 is a schematic plan view of the thin film RE resonator according to the third embodiment. FIG. 18A shows a section of the thin film RE resonator according to the third embodiment and is a schematic sectional view taken along line I-I' of FIG. 17. FIG. 18B is a schematic sectional view taken along line II-II' of FIG. 17.

A thin film RE resonator 1 is formed on an insulating substrate 2. The thin film RE resonator 1 includes one circular resonance part 7 having one vibration unit and a tuning fork-shaped supporter (first supporter 20, second supporter 21) that is electrically and mechanically connected to this resonance part at two points where the resonator and the supporter face each other. The resonance part 7 has a multilayer structure including a piezoelectric material 5 (5-0) and a pair of upper electrode 3 and a lower electrode 4. At least a part of the piezoelectric material is interposed between the pair of the upper electrode 3 and the lower electrode 4.

The first supporter 20 includes a pair of arms 20-1 connected to the second supporter 21 by the node 11C and connection parts 20-2 for connecting the arms and the resonance part 7. Each of the arms 20-1 includes a piezoelectric material 5 (5-4), an upper electrode 3, and a lower electrode 4. The connection parts 20-2 are provided at two points that are symmetrical with respect to a node 11A which is the center of resonance part 7, and each include the piezoelectric material 5 (5-4), the upper electrode 3, and the lower electrode 4. A second supporter 21 includes the upper electrode 3, the lower electrode 4, terminals 9-1 and 9-2, and the piezoelectric material 5 (5-3). The supporters 20 and 21 also serve as electrical drawing lines. The upper electrode 3 is connected to the terminal 9-1 via the upper electrode 3 in the supporter, and the lower electrode 4 is connected to the terminal 9-2 via the lower electrode 4 in the supporter. Each supporter is provided with two drawing lines on the front and back sides thereof. In other words, the upper electrode 3 is connected to the terminal 9-1 via the upper drawing line and the lower electrode 4 is connected to the terminal 9-2 via the lower drawing line.

The supporter (20, 21) of the resonance part takes the shape of a single-support tuning fork. Specifically, the supporter is elastically fixed to the insulating substrate 2 at one fixing point (second supporter 21), serves as one supporter from the fixing point up to a branch point, and branches into two supporters (arms 20-1) after passing through the branch point. The resonance part 7 is elastically held between the two branching supporters with the connection parts (20-2) therebetween. The supporter (20, 21) and the resonance part 7 have a common symmetry plane passing through the fixing point. The width of at least a part of the branching part (20-1, 20-2) of the supporter is one-fourth or less of that of the resonator.

The supporter (20, 21) takes the shape of a single-support tuning fork and has electrodes formed on the upper and lower surfaces thereof, but it does not act as a tuning fork causes vibrations. Specifically, while a tuning fork freely makes flection vibrations at its branching ends to cause stable elastic vibrations, such ends cannot freely vibrate in this embodiment because the ends are elastically connected to the vibration unit 7. Further, the solid electrodes 3 and 4 formed on the upper and lower surfaces of the supporter cannot excite flection vibrations strongly.

Figure 19:
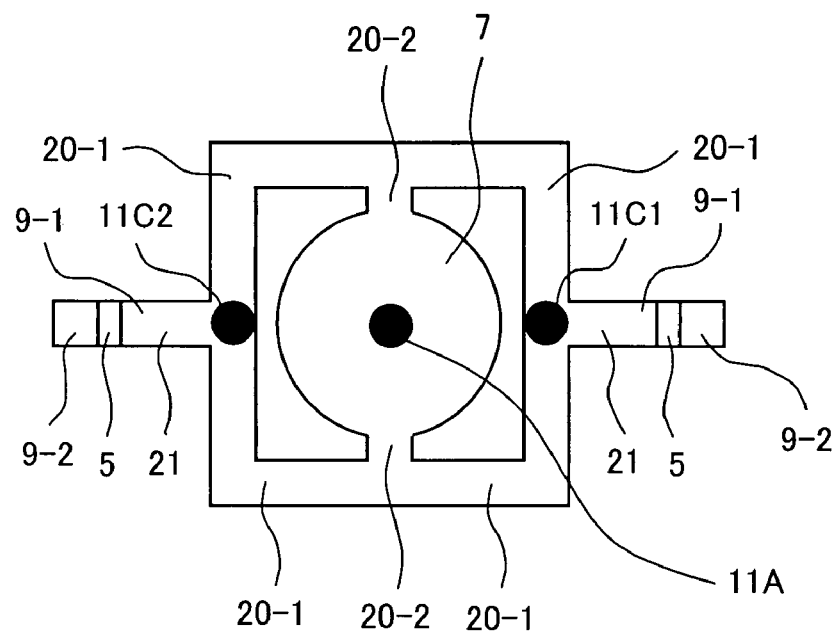
FIG. 19 is a schematic plan view of a thin film RE resonator according to a modification of the third embodiment.

While the third embodiment has been described using the supporter having a single-support structure as an example, the same goes for a supporter having a double-support structure shown in FIG. 19. In an example of a double-support shown in FIG. 19, a thin film RE resonator 1 includes one circular resonance part 7 and a supporter having a double-support structure (first supporter 20, second supporter 21) electrically and mechanically connected to the resonator 7 at two points where the supporter and the resonance part face each other. The resonance part 7 has a multilayer structure including a piezoelectric material 5 and a pair of an upper electrode 3 and a lower electrode 4, and at least a part of the piezoelectric material is interposed between the upper electrode 3 and the lower electrode 4. A first supporter 20 includes a pair of arms 20-1 connected to the second supporter 21 at nodes 11C1 and 11C2 and connection parts 20-2 provided at two points that are symmetrical with respect to a node 11A which is a the center of the resonance part 7. The width of at least a part of the branching parts (20-1, 20-2) of the supporter is one-fourth or less of that of the resonance part.

Since the branch point of the supporter (20, 21) matches the node 11 (11C1, 11C2), the supporter serves as a rigid supporter, regardless of which of single-support and double-support its support structure is. Specifically, the arms 20-1 of the first supporter 20 serve as elastic supporters that are elastically connected to the resonance part 7 in a weak manner, Therefore, RE vibration energy enters into the arms 20-1, while RE vibrations are mode-converted into flection vibrations in the two arms 20-1 and the two arms 20-1 vibrate in opposite phases. As a result, the node is generated at the branch point, the second supporter 21 disposed on the center of the arms 20-1 serves as ideal rigid supporter.

In the third embodiment, the two arms 20-1 are electrically and elastically connected to the resonance part 7, and the second supporter 21 provided at the node(s) 11 generated at the branch point(s) is provided with drawing lines, so these drawing lines serve as accurate nodes. Further, since the drawing lines that act as elastic supporters are not directly connected to the resonance part, leakage of elastic energy that causes a deterioration of the Q value is prevented (that is, the supporter serves as an ideal, rigid supporter). Further, carrying out electrical wiring using the two arms 20-1 eliminates the need for providing air wiring. This realizes a low-cost thin film RE resonator with a high Q value.

The arms 20-1 and 20-2 of the supporter each include the piezoelectric material 5 and the electrode 3 and 4 provided on the upper and lower surfaces of the piezoelectric material 5, so spurious mode occurs in the supporter besides RE mode. As described in the first embodiment, the width of the supporter is preferably one-fourth or less of that of the resonance part in order to suppress the spurious mode.

According to this embodiment, the vibration node(s) is located at the branch point(s) of the single-support/double-support structure supporting the single resonance part 7 and the second supporter 21 for fixing the resonator is formed at the node(s). Therefore, the supporter serves as an ideal, rigid supporter. Connecting the drawing lines to the branch point(s) prevents leakage of elastic energy that causes a deterioration of the Q value. This realizes a high Q.

Further, the stopband of the filter using the thin film piezoelectric bulk acoustic wave resonators is made wider. Furthermore, according to this embodiment, the difference in resonance frequency is controlled by adjusting a size in-plane directions. Thus, a low-cost thin film piezoelectric bulk acoustic wave resonator is provided without requiring an expensive film forming apparatus.

Fourth Embodiment

Figure 20:
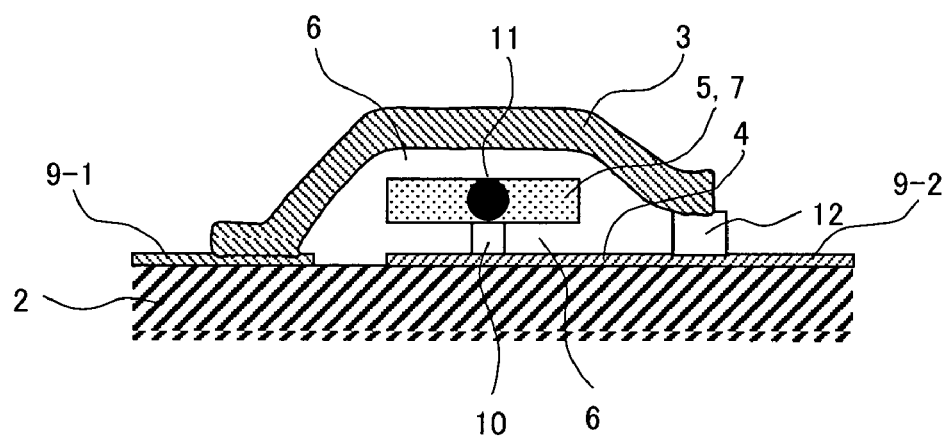
FIG. 20 is a schematic longitudinal sectional view of a thin film RE resonator according to a fourth embodiment of the present invention.

Referring now to FIG. 20, a thin film RE resonator according to a fourth embodiment of the present invention will be described. An upper electrode 3 and a lower electrode 4 need not always be brought into contact with the front and back surfaces of a piezoelectric material 5. In this embodiment, a supporter 10 is formed only at the center of the lower surface of the piezoelectric material 5. The center of a resonance part 7 including one vibration unit serves as a vibration node 11, so the supporter serves as a rigid supporter.

Unlike in the first to third embodiments, the upper electrode 3 elastically floats above the resonance part 7. Therefore, an electrical drawing line may be connected to the upper electrode 3. Since the upper electrode 3 is elastically insulated from the resonance part 7, the Q value does not deteriorate even if the drawing line is thickened. For this reason, in the fourth embodiment, the upper electrode 3 and the drawing line cover the resonance part 7, thereby forming a thin film package. In this case, an insulating thin film 12 must be provided between a drawing line from the lower electrode 4 and the thin film package in order to prevent a short circuit between the upper and lower electrodes.

In order to realize a high Q in a thin film RE resonator, the resonance part 7 is required to be elastically isolated. In the fourth embodiment, the supporter 10 matches the node 11, so it serves as an ideal, rigid supporter. Also, in order to cause a resonator to operate, electrodes having two polarities and drawing lines therefrom are required. In the fourth embodiment, the electrodes are elastically insulated from the vibration unit, and the drawing lines that act as elastic supporters are not directly connected to the resonance part. Therefore, leakage of elastic energy that causes a deterioration of the Q value is completely prevented. Further, since the thickness and area of the drawing line from the upper electrode 3 can be sufficiently increased, a resistance loss can be avoided. This realizes a still higher Q value than those in the previous embodiments.

Fifth Embodiment

A band-pass filter according to a fifth embodiment of the present invention will now be described with reference to FIGS. 21 to 24.

Figure 21:
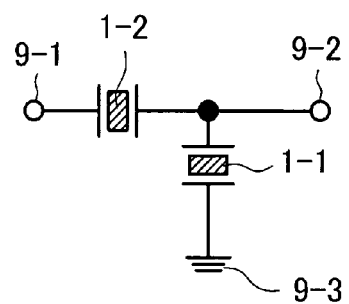
FIG. 21 is an equivalent circuit diagram of a band-pass filter according to a fifth embodiment of the present invention, in which thin film RE resonators are connected to a series arm and a parallel arm.
Figure 22:
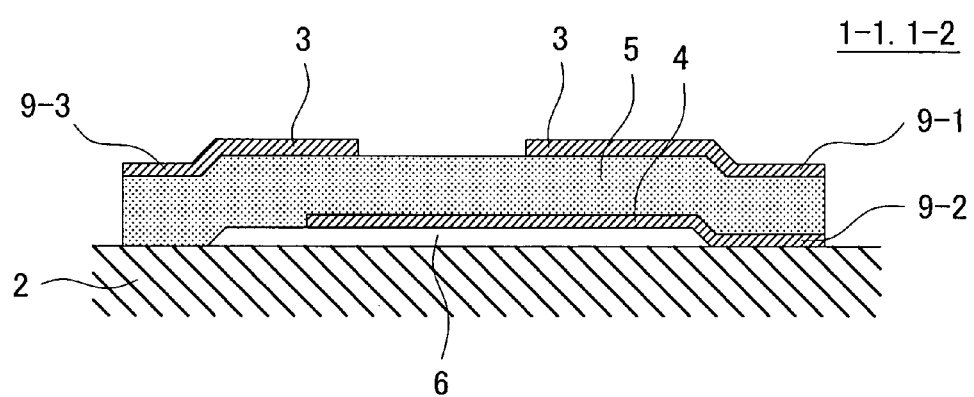
FIG. 22 shows a longitudinal sectional view of the band-pass filter according to the fifth embodiment.
Figure 23:
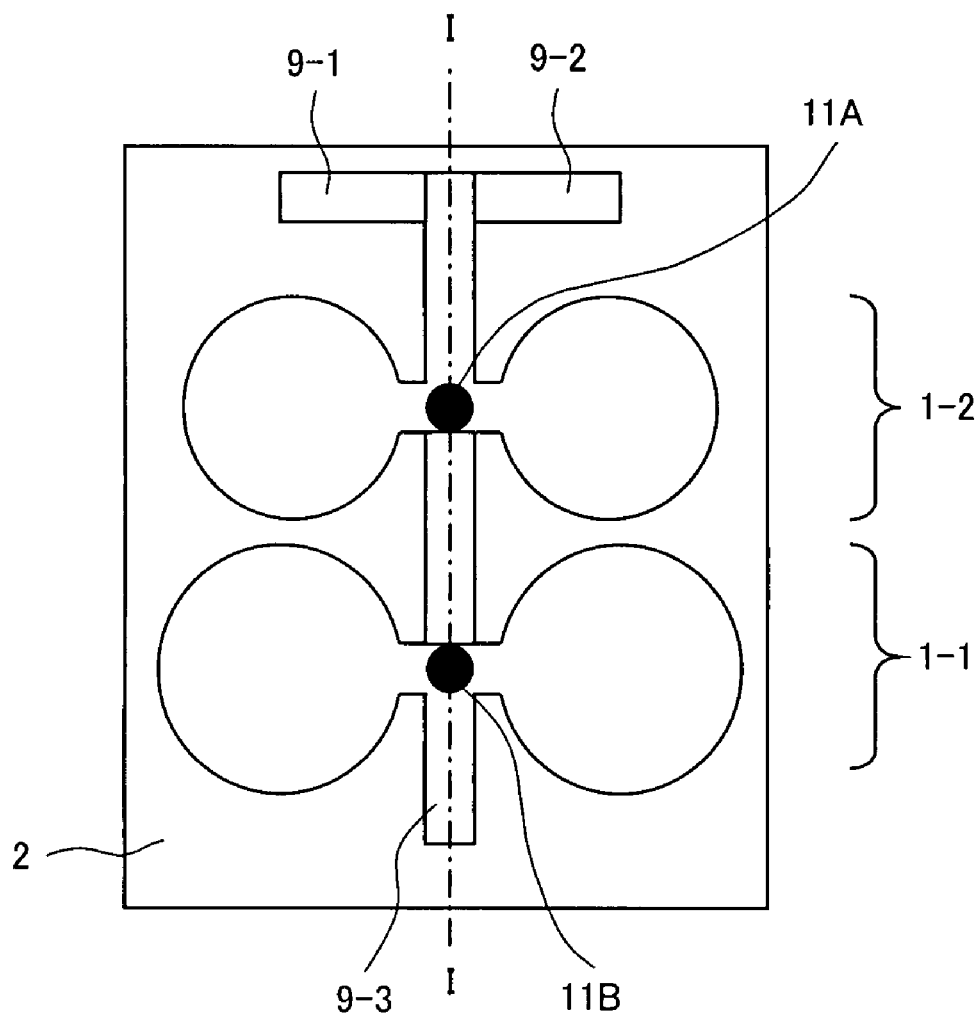
FIG. 23 shows a schematic plan view of the band-pass filter according to the fifth embodiment.

First, FIG. 21 shows an equivalent circuit diagram of the fifth embodiment. The fifth embodiment is a band-pass filter to which two thin film RE resonators are connected, and includes one series-arm resonator 1-2 connected between input/output terminals 9-1 and 9-2 in series and one parallel-arm resonator 1-1 connected to the series-arm resonator 1-2, the output terminal 9-2 and a ground 9-3. FIGS. 22 and 23 show schematic views of the fifth embodiment. FIG. 22 shows a longitudinal sectional view of the band-pass filter, and FIG. 23 shows a plan view thereof. Here, for example, the two thin film RE resonator 1 according to the first embodiment is used, one of which serves as the series-arm resonator 1-2 and the other of which serves as the parallel-arm resonator 1-1.

As shown in the equivalent circuit diagram of FIG. 21, one electrode of the parallel-arm resonator 1-1 is connected to one electrode of the series-arm resonator 1-2, and the other electrode of the parallel-arm resonator 1-1 is connected to the ground 9-3. The two electrodes of the series-arm resonator 1-2 are connected to the input/output terminals 9-1 and 9-2.

Figure 24:
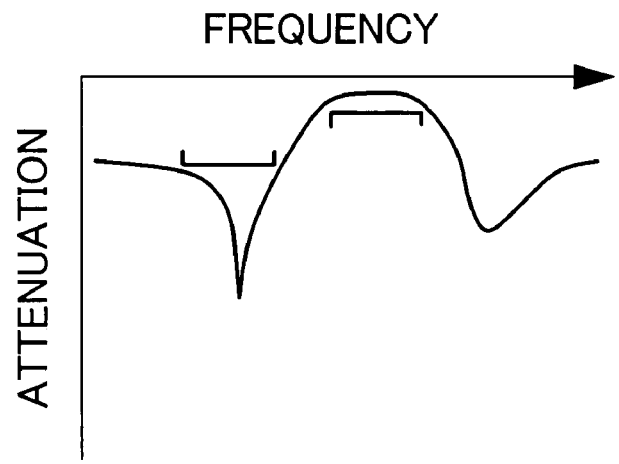
FIG. 24 is a graph showing a frequency characteristic of a high-pass filter according to the fifth embodiment, in which thin film RE resonators are implemented in the equivalent circuit diagram shown in FIG. 21.

FIG. 24 shows a frequency characteristic of the fifth embodiment. In FIG. 24, a frequency whose attenuation is rapidly increased from the series resonant frequency to the parallel resonant frequency of the series-arm resonator 1-2 is matched with a frequency at an end of a high-frequency passband and a frequency whose attenuation is rapidly decreased from the series resonant frequency to the parallel resonant frequency of the parallel-arm resonator 1-1 is matched with a frequency at an end of a low-frequency passband. Thus, the fifth embodiment serves as a band-pass filter.

The passband width of the band-pass filter is determined by the difference in frequency between the series-arm resonator 1-2 and the parallel-arm resonator 1-1. Therefore, such a passband width must be controlled with an extremely high accuracy. In this embodiment, the diameter of the resonance part of the series-arm resonator 1-2 is set so as to be smaller than that of the parallel-arm resonator 1-1. The difference in resonance part diameter is controlled by adjusting the patterns on the photomasks and the difference in size between the patterns on the photomasks is made with almost no error. As a result, the bandwidth of the band-pass filter according to the fifth embodiment is set up highly accurately to the extent to which its variations that occur between wafers or in a wafer during manufacturing may be almost completely ignored. Therefore, the assured filter characteristic in which process variations are considered is significantly improved. Further, since the number of films of the resonators used in the band-pass filter according to the fifth embodiment is smaller than that of the resonator disclosed in the above U.S. Pat. No. 6,617,249 by one film, the band-pass filter is manufactured with a smaller number of steps and a low cost.

Thus, according to the band-pass filter using the first embodiment or the like, a low-cost filter is provided by making the diameter of the resonance part of the series-arm resonator 1-2 smaller by one than that of the parallel-arm resonator 1-1.

Sixth Embodiment

A high-pass filter according to a sixth embodiment of the present invention will now be described with reference to FIGS. 25 and 26.

Figure 25:
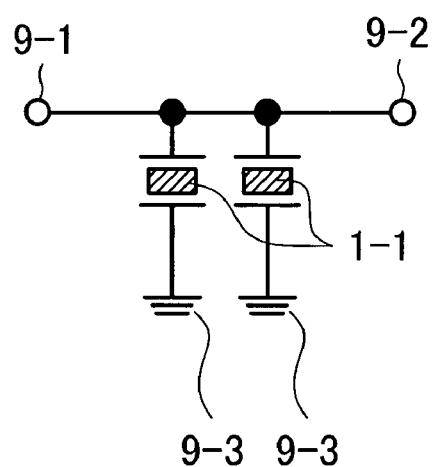
FIG. 25 is an equivalent circuit diagram showing a frequency characteristic of a high-pass filter according to a sixth embodiment of the present invention, in which two resonators are connected to a parallel arm.

As shown in an equivalent circuit diagram of FIG. 25, this embodiment is a high-pass filter to which two resonators are connected in parallel. Specifically, the high-pass filter includes two parallel-arm resonators 1-1 connected between a signal line provided between input/output terminal 9-1 and 9-2, and a ground 9-3. The two parallel-arm resonators 1-1 are, for example, the resonators according to the second embodiment. Since such resonators are set so as to be different in resonance part diameter, they have different resonant frequencies.

Figure 26A:
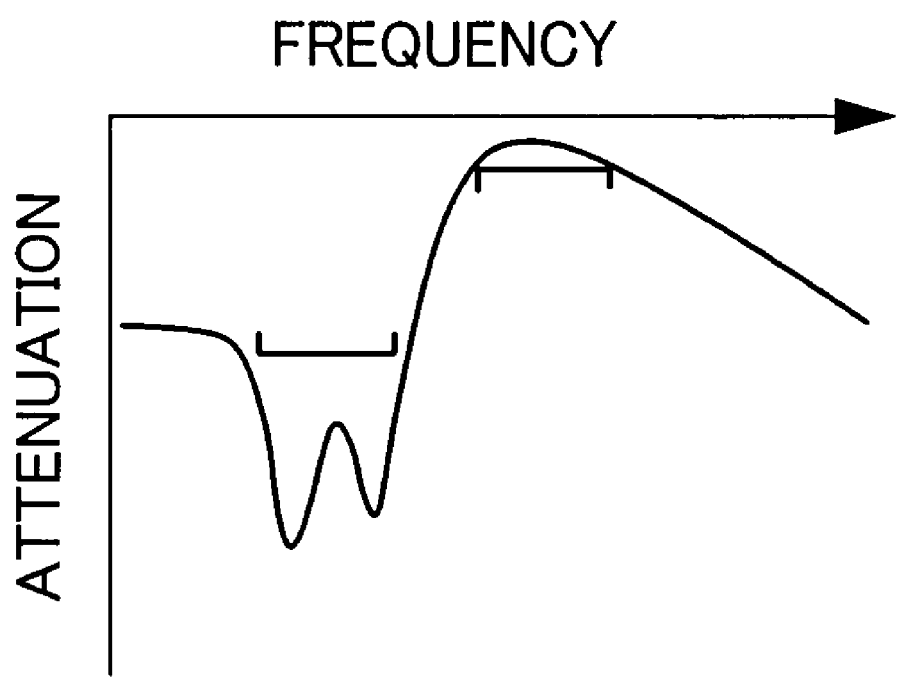
FIG. 26A is a graph showing a frequency characteristic of a high-pass filter according to a sixth embodiment of the present invention, in which resonators are implemented in the equivalent circuit diagram shown in FIG. 25.

FIG. 26A shows a frequency characteristic of the sixth embodiment. In FIG. 26A, a frequency whose attenuation is rapidly decreased from the series resonant frequency to the parallel resonant frequency of the parallel-arm resonator is matched with a frequency at an end of a low-frequency passband. Therefore, the sixth embodiment serves as a high-pass filter.

The stopband width of the high-pass filter is determined by the series resonant frequency of the two parallel-arm resonators 1-1. Therefore, such stopband width must be controlled with an extremely high accuracy. In this embodiment, the diameters of the resonance parts of the two parallel-arm resonators 1-1 are set to different values. The difference in resonance part diameter is controlled by adjusting the patterns on the photomasks and the difference in size between the patterns on the photomasks is made with almost no error. As a result, the bandwidth of the high-pass filter according to the sixth embodiment is set up highly accurately to the extent to which its variations that occur between wafers or in a wafer during manufacturing may be almost completely ignored. Therefore, the assured attenuation characteristic in which process variations are considered is significantly improved.

Figure 26B:
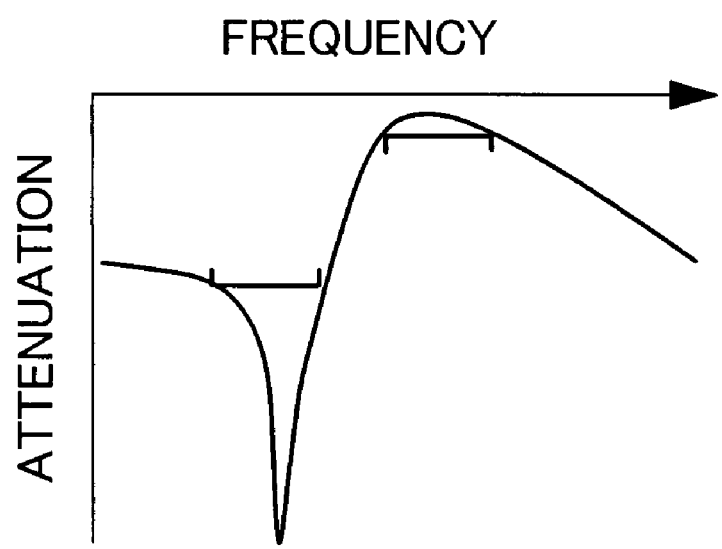
FIG. 26B is a graph showing a pass characteristic of a related-art high-pass filter, as a comparative example.

Incidentally, a high-pass filter that includes one parallel-arm resonator can be realized as a comparative example. As shown in FIG. 26B, a high-pass filter using one parallel-arm resonator is excellent in terms of the peak attenuation of the stopband; however, its stopband is narrow and the minimum attenuation in the stopband is remarkably deteriorated. Also, if the technology disclosed in U.S. Pat. No. 6,617,249 or the like is used, it is expected that an electrical characteristic similar to that of this embodiment will be realized. However, the number of films of the resonators used in this embodiment is smaller by one than that of the resonator disclosed in U.S. Pat. No. 6,617,249 or the like by one. Therefore, the high-pass filter according to this embodiment is manufactured with a smaller number of steps and a low cost.

Also, it is conceivable to use an inductance to make different the resonant frequencies of the two parallel-arm resonators. Specifically, setting the resonant frequencies of the parallel-arm resonators to identical values and putting inductances having different values between the resonators and the ground allows the effective series resonant frequency to be shifted to a lower frequency. In this method, the number of films of the resonators is smaller by one than that of the resonator disclosed in U.S. Pat. No. 6,617,249 or the like. Therefore, the number of steps is made smaller and the wafer step is made low-cost. However, an inductance manufactured on a wafer generally causes a large loss and a special step is required to make such a loss smaller. Therefore, it is difficult to achieve both a low cost and a low loss. Further, the loss is made lower to some extent by disposing an inductance outside a wafer; however, such a method newly causes problems of a high cost and an increase in area due to providing an inductance outside a wafer.

Thus, according to the high-pass filter according to this embodiment, a low-cost filter whose frequency characteristic is significantly improved by using multiple parallel-arm resonators including the resonance parts 7 having different diameters is provided.

As described above, according to this embodiment, the resonance frequency is fine-tuned by adjusting the structure provided on the first metal thin film in the photomask and exposure steps. Further, even if thin film bulk acoustic wave resonators having different resonant frequencies are formed on an identical substrate, there is no need for providing an additional film. This reduces the number of steps to be performed when manufacturing a filter by one compared with that in U.S. Pat. No. 6,617,249, resulting in a reduction in cost. Furthermore, the difference in resonance frequency is controlled by adjusting a size in in-plane directions. Therefore, a still more low-cost thin film piezoelectric bulk acoustic wave resonator is provided without requiring an expensive film forming apparatus.

Further, the stopband of the filter using the thin film piezoelectric bulk acoustic wave resonators is made wider without increasing the number of steps.

As described above, according to this embodiment, the resonance frequency is fine-tuned by adjusting the diameter of the resonance part in the photomask and exposure steps. In other words, multiple thin film piezoelectric bulk acoustic wave radio-frequency resonators having different resonance frequencies are realized without increasing the number of steps in the process of forming the upper electrode by adjusting the diameters of the resonance parts of such resonators when forming such resonators on an identical substrate.

Seventh Embodiment

A low-pass filter according to a seventh embodiment of the present invention will now be described with reference to FIGS. 27, 28A, and 28B.

Figure 27:
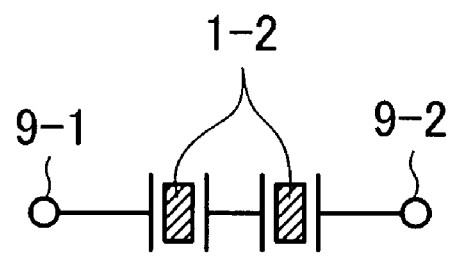
FIG. 27 is an equivalent circuit diagram of a low-pass filter according to a seventh embodiment of the present invention, in which two resonators are connected to a series arm.

As shown in an equivalent circuit diagram of FIG. 27, this embodiment is a low-pass filter in which two resonators are connected to a series-arm in series, and includes two series-arm resonators 1-2 connected between input/output terminal 9-1 and 9-2. The two series-arm resonators 1-2 are, for example, the resonators according to the first embodiment, and have different resonant frequencies because the diameters of the resonance parts are set to different values.

Figure 28A:
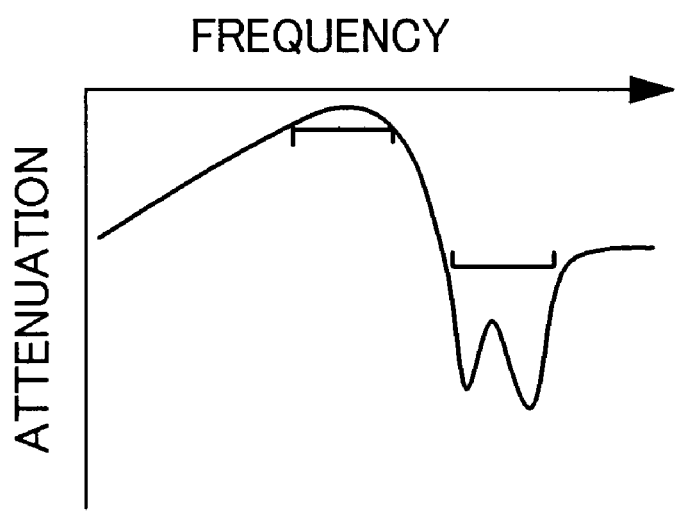
FIG. 28A is a graph showing a frequency characteristic of a low-pass filter according to a seventh embodiment of the present invention, in which resonators are implemented in the equivalent circuit diagram shown in FIG. 27.
Figure 28B:
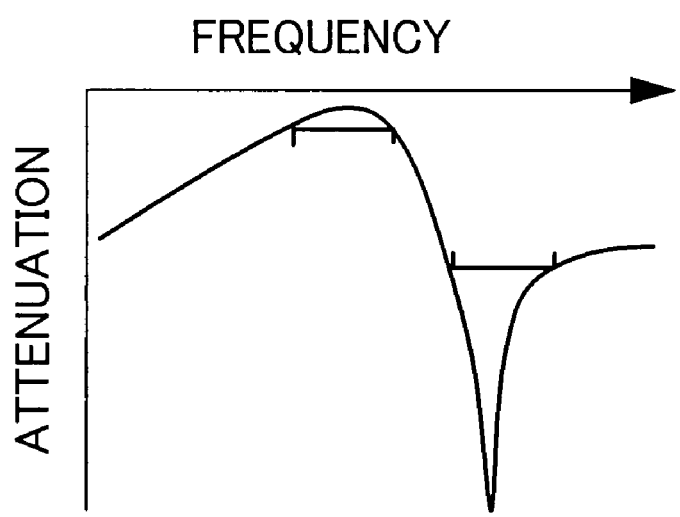
FIG. 28B is a graph showing a pass characteristic of a related-art low-pass filter, as a comparative example.

FIG. 28A shows a frequency characteristic of this embodiment. In FIG. 28A, a frequency whose attenuation is rapidly increased from the series resonant frequency to the parallel resonant frequency of the series-arm resonators 1-2 is matched with a frequency at an end of a high-frequency passband. Thus, the seventh embodiment serves as a low-pass filter.

The stopband width of the low-pass filter is determined by the parallel resonant frequency of the two series-arm resonators 1-2. Therefore, such stopband width must be controlled with an extremely high accuracy. In this embodiment, the diameters of the resonance parts 7 of the two series-arm resonators 1-2 are set to different values. The difference in the diameter of the resonance part 7 is controlled by adjusting the patterns on the photomasks and the difference in size between the patterns on the photomasks is made with almost no error. As a result, the bandwidth of the low-pass filter according to this embodiment is set up highly accurately to the extent to which its variations that occur between wafers or in a wafer during manufacturing may be almost completely ignored. Therefore, the assured attenuation characteristic of the stopband in which process variations are considered is significantly improved.

A low-pass filter including a single series-arm resonator can be realized as a comparative example. As shown in FIG. 28B, a low-pass filter using one series arm resonator is excellent in terms of the peak attenuation of the stopband, but its stopband is narrow and the minimum attenuation in the stopband remarkably deteriorates. Further, if the technology disclosed in U.S. Pat. No. 6,617,249 or the like is used or if an inductance is used, it is expected that an electrical characteristic similar to that of this embodiment will be realized. However, as described in the sixth embodiment, it is difficult to achieve both a low cost and a low loss, or problems of a high cost and an increase in area occur.

Thus, according to the low-pass filter using the first embodiment or the like, a low-cost filter whose frequency characteristic is significantly improved by using multiple series-arm resonators including resonance parts having different diameters is provided.

Eighth Embodiment

Figure 29:
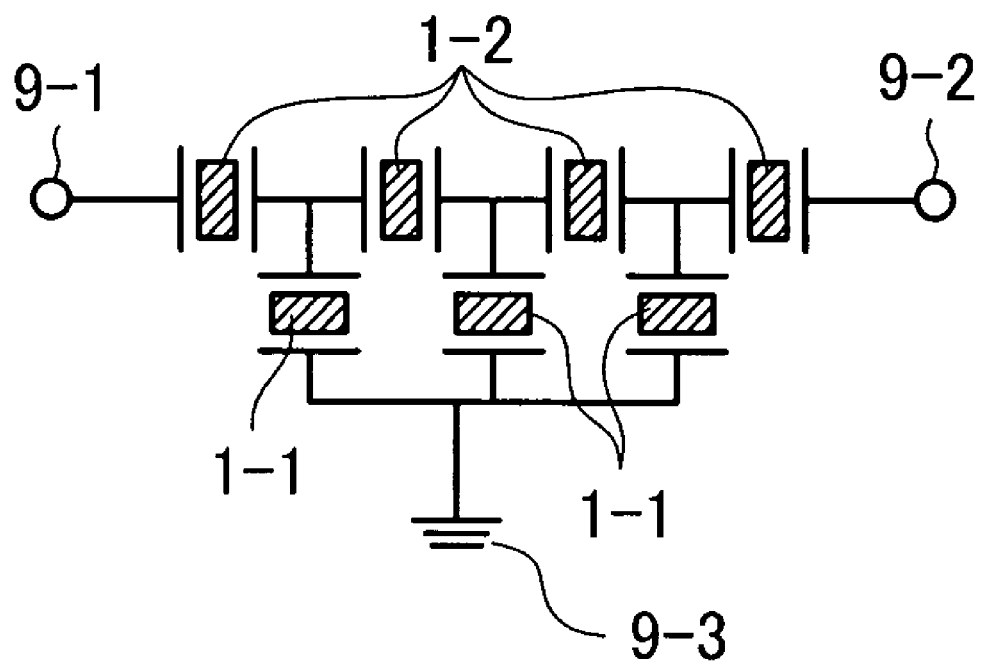
FIG. 29 is an equivalent circuit diagram of a ladder-type filter according to an eighth embodiment of the present invention.
Figure 30:
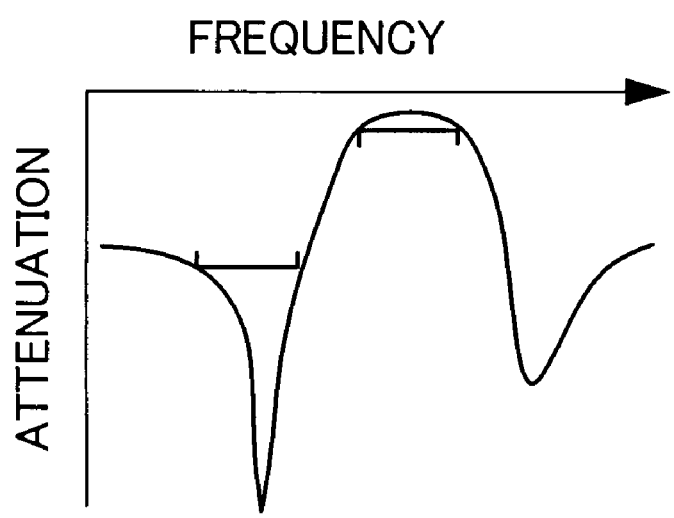
FIG. 30 is a graph showing a frequency characteristic of the ladder-type filter according to the eighth embodiment.

A band-pass filter according to an eighth embodiment of the present invention will now be described with reference to FIGS. 29 and 30. FIG. 29 is an equivalent circuit diagram showing the eighth embodiment. FIG. 30 is a graph showing a frequency characteristic of the band-pass filter according to the eighth embodiment shown in FIG. 29.

This embodiment is a ladder-type band-pass filter to which, for example, the seven resonators according to the first embodiment are connected, and includes four series-arm resonators 1-2 series-connected between input/output terminals (9-1, 9-2) and three parallel-arm resonators 1-1 connected between the four series-arm resonators 1-2 and a ground (9-3). The series-arm resonators 1-2 and the parallel-arm resonators 1-1 have different resonance frequencies because the diameters of the resonance parts of the series-arm resonators are set to different values from those of the parallel-arm resonators.

FIG. 30 shows a frequency characteristic of this embodiment. In FIG. 30, a frequency whose attenuation is rapidly increased from the series resonant frequency to the parallel resonant frequency of the series-arm resonators 1-2 is matched with a frequency at an end of a high-frequency passband, and a frequency whose attenuation is rapidly decreased from the series resonant frequency to the parallel resonant frequency of the parallel-arm resonators 1-1 is matched with a frequency at an end of a low-frequency passband. Thus, the eighth embodiment serves as a ladder-type band-pass filter.

The passband width of the ladder-type band-pass filter is determined by the difference in frequency between the series-arm resonators 1-2 and the parallel-arm resonators 1-1. Therefore, such a passband width must be controlled with an extremely high accuracy. In this embodiment, the diameters of the resonance parts of the series-arm resonators 1-2 are set so as to be smaller than those of the parallel-arm resonators 1-1. The difference in resonance part diameter is controlled by adjusting the patterns on the photomasks and the difference in size between the patterns on the photomasks is made with almost no error. As a result, the bandwidth of the band-pass filter according to this embodiment is set up highly accurately to the extent to which its variations that occur between wafers or in a wafer during manufacturing may be almost completely ignored. Therefore, the assured filter characteristic in which process variations are considered is significantly improved. Further, since the number of films of the resonators included in the band-pass filter is smaller by one than the resonator disclosed in U.S. Pat. No. 6,617,249 or the like, the band-pass filter is manufactured with a smaller number of steps and a low cost.

Thus, according to the ladder-type band-pass filter using the first embodiment or the like, a low-cost filter whose frequency characteristic is significantly improved by making the diameters of the resonance parts of the series-arm resonators 1-2 larger than those of the parallel-arm resonators 1-1 is provided.

Ninth Embodiment

In the ladder-type band-pass filter according to the eighth embodiment, the frequency characteristic is further improved by setting the diameters of the resonance parts of the three parallel-arm resonators to different values.

Figure 31:
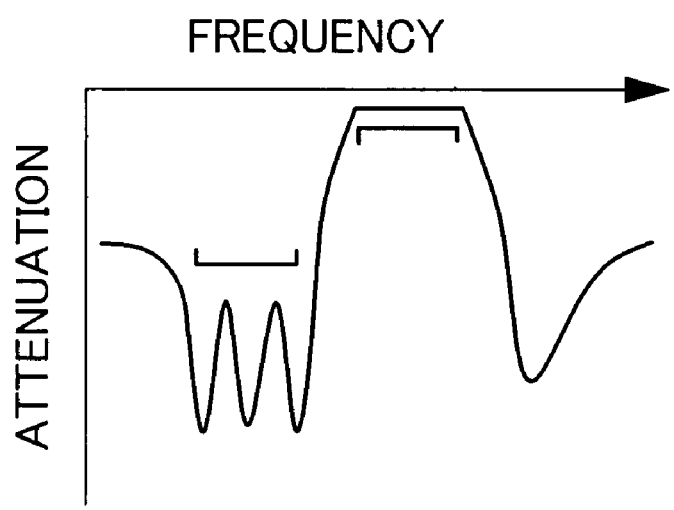
FIG. 31 is a graph showing a frequency characteristic of a ladder-type filter according to a ninth embodiment of the present invention.

A band-pass filter according to a ninth embodiment of the present invention will now be described with reference to FIG. 31. The equivalent circuit of this embodiment is the same as that of the eighth embodiment. This embodiment is different from the eighth embodiment in that the diameters of the resonance parts of three parallel-arm resonators 1-1 are different. FIG. 31 shows a frequency characteristic of this embodiment. In FIG. 31, as with the eighth embodiment, a frequency whose attenuation is rapidly increased from the series resonant frequency to the parallel resonant frequency of the series-arm resonators 1-2 is matched with a frequency at an end of a high-frequency passband, and a frequency whose attenuation is rapidly decreased from the series resonant frequency to the parallel resonant frequency of the parallel-arm resonators 1-1 is matched with a frequency at an end of a low-frequency passband. Thus, the ninth embodiment serves as a ladder-type band-pass filter.

Unlike in the eighth embodiment, the width of a low-frequency stopband of the band-pass filter is made wider by the three parallel-arm resonators 1-1. Therefore, compared with the eighth embodiment, the peak attenuation in the stopband is deteriorated, but the stopband is made wider, thereby having an advantage of noticeably improving the minimum attenuation in the stopband.

The width of the low-frequency stopband of the band-pass filter is determined by the series resonant frequency of the three parallel-arm resonators 1-1. Therefore, it must be controlled with an extremely high accuracy. In this embodiment, the diameters of the resonance parts of the three parallel-arm resonators 1-1 are set to different values. The difference in resonance part diameter is controlled by adjusting the patterns on the photomasks and the difference in size between the patterns on the photomasks is made with almost no error. As a result, the bandwidth of the band-pass filter according to the ninth embodiment is set up highly accurately to the extent to which its variations that occur between wafers or in a wafer during manufacturing may be almost completely ignored. Therefore, the assured attenuation characteristic of the stopband in which process variations are considered is significantly improved.

If the technology disclosed in U.S. Pat. No. 6,617,249 or the like is used or if an inductance is used, it is expected that an electrical characteristic similar to that of this embodiment will be realized. However, as described in the eighth embodiment, it is difficult to achieve both a low cost and a low loss, or problems of a high cost and an increase in area occur.

Thus, according to the band-pass filter using any one of the embodiments, a low-cost filter whose frequency characteristic is significantly improved by using multiple parallel-arm resonators 1-1 including the resonance parts having different diameters is provided.

Tenth Embodiment

A ladder-type band-pass filter according to a tenth embodiment of the present invention will now be described with reference to FIGS. 32 and 33.

Figure 32:
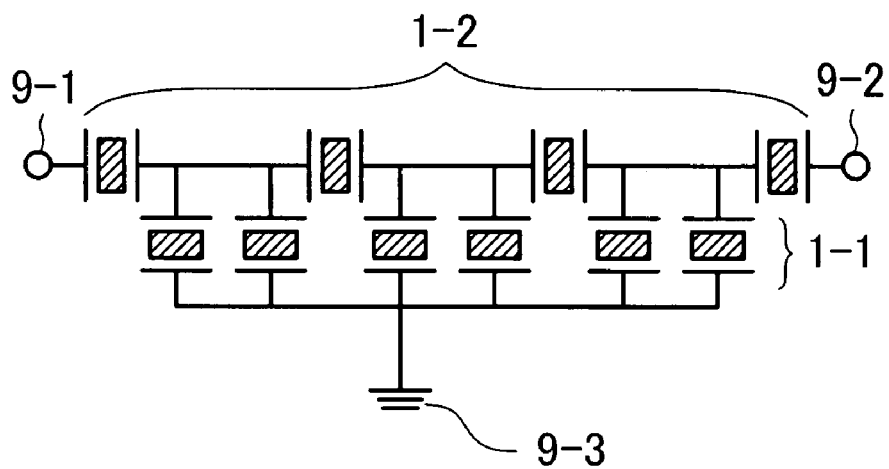
FIG. 32 is an equivalent circuit diagram of a ladder-type filter according to a tenth embodiment of the present invention.

FIG. 32 is an equivalent circuit diagram of the tenth embodiment. This embodiment is a ladder-type band-pass filter to which the ten thin film bulk acoustic wave resonator 1 according to the second embodiment are connected. In this embodiment, the three parallel-arm resonators 1-1 included in the ladder-type band-pass filter according to the ninth embodiment are each divided into two parallel resonators and the diameters of the resonance parts of the divided resonators are set to different values.

Figure 33:
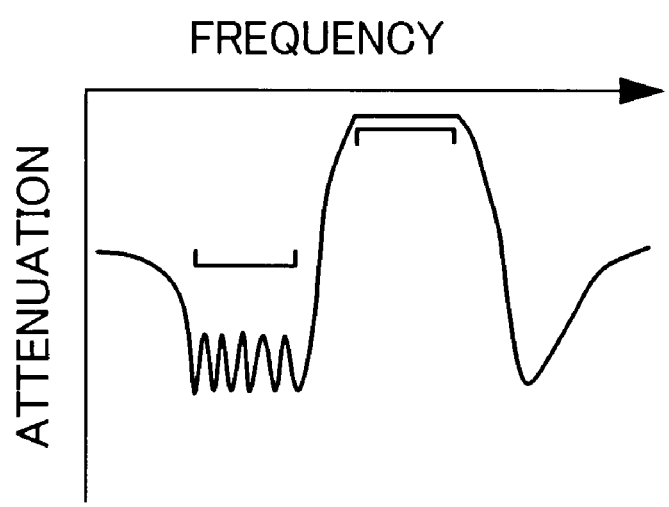
FIG. 33 is a graph showing a frequency characteristic of the ladder-type filter according to the tenth embodiment.

FIG. 33 shows a frequency characteristic of the tenth embodiment. In FIG. 30, as with the ninth embodiment, a frequency whose attenuation is rapidly increased from the series resonant frequency to the parallel resonant frequency of the series-arm resonators 1-2 is matched with a frequency at an end of a high-frequency passband, and a frequency whose attenuation is rapidly decreased from the series resonant frequency to the parallel resonant frequency of the parallel-arm resonators 1-1 is matched with a frequency at an end of a low-frequency passband. Thus, the tenth embodiment serves as a ladder-type band-pass filter.

The width of a low-frequency stopband of the band-pass filter is made wider thanks to the six parallel-arm resonators. Therefore, compared with the ninth embodiment, the peak attenuation in the stopband is deteriorated, but the stopband is made wider, thereby having an advantage of noticeably improving the minimum attenuation in the stopband.

Thus, according to the ladder-type band-pass filter using the first embodiment or the like, a low-cost filter whose frequency characteristic is significantly improved by dividing parallel the parallel-arm resonators 1-1 and using the divided multiple parallel-arm resonators 1-1 including resonance parts having different diameters is provided.

Eleventh Embodiment

Figure 34:
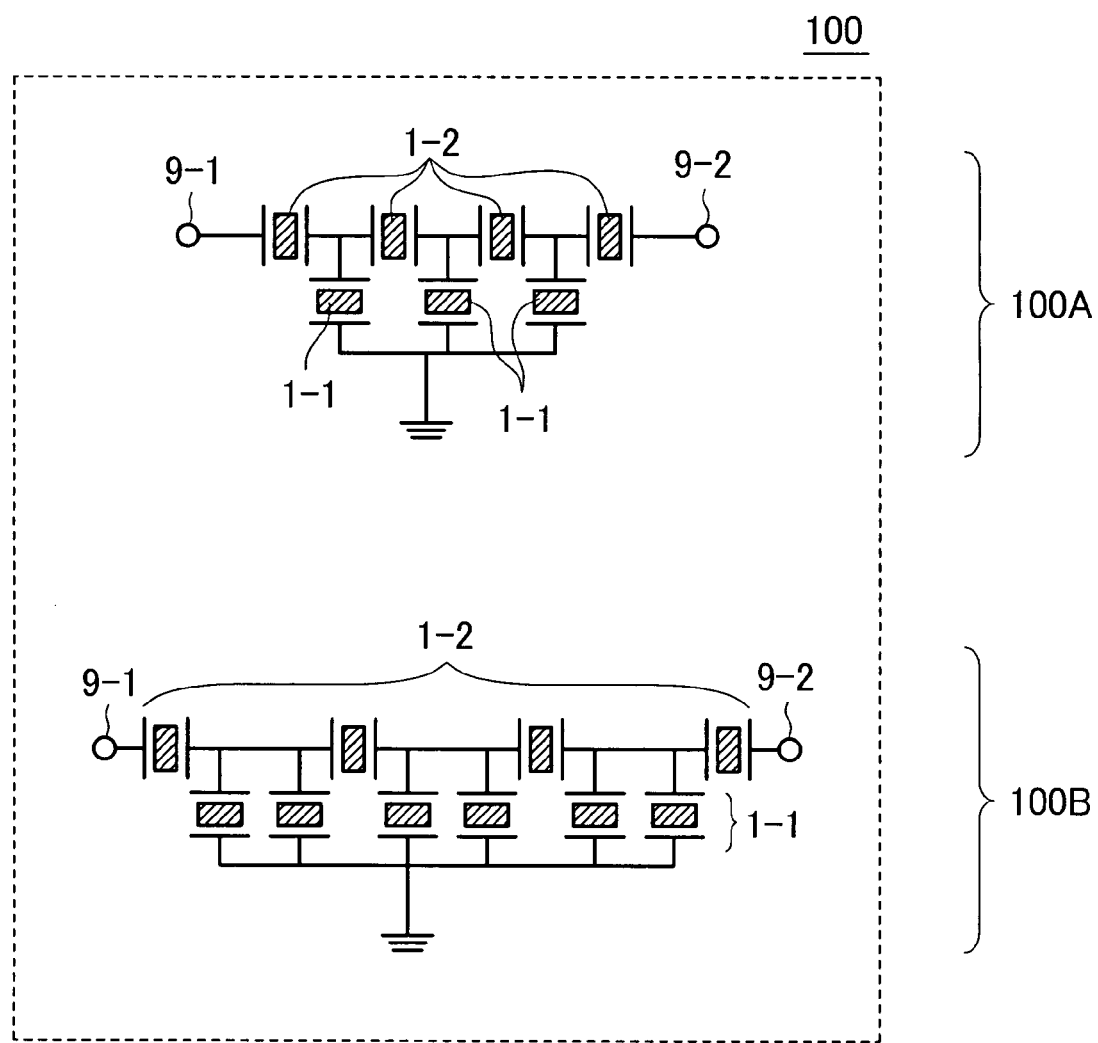
FIG. 34 is an equivalent circuit diagram of a filter module serving as a branching filter according to an eleventh embodiment of the present invention, in which a transmission filter and a reception filter are formed on an identical chip.

A ladder-type band-pass filter according to an eleventh embodiment of the present invention will now be described with reference to FIGS. 34 and 35. FIG. 34 is an equivalent circuit diagram of the eleventh embodiment. In this specification, for convenience, a filter in which the main stopband is provided on the high-frequency side of a passband is referred to as a "transmission filter," and a filter in which the main stopband is provided on the low-frequency side of the passband is referred to as a reception filter.

In a ladder-type band-pass filter 100 according to this embodiment, two ladder-type band-pass filters (a transmission filer 100A and a reception filter 100B) that include the seventeen thin film piezoelectric bulk acoustic wave resonator 1 (1-1, 1-2) according to the first embodiment or the like and serve as branching filters are formed on an identical substrate. The diameters of the resonance parts of the seventeen resonators 1 included in the ladder-type band-pass filter 100 are set to different values in order to optimize a frequency characteristic.

Figure 35A:
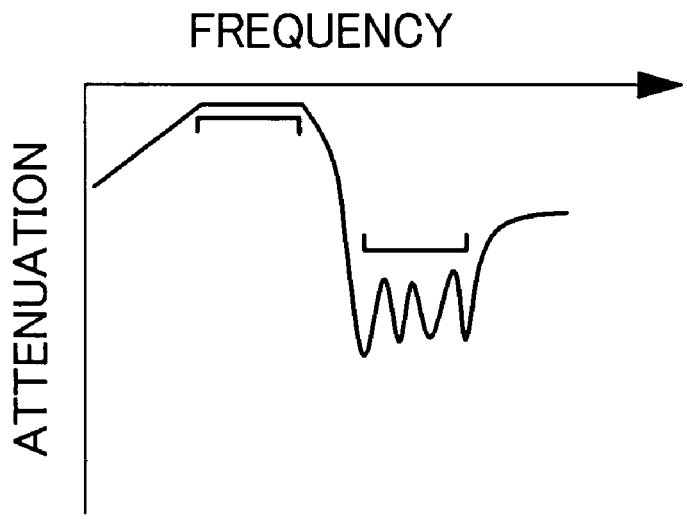
FIG. 35A is a graph showing a frequency characteristic of the transmission filter according to the eleventh embodiment.
Figure 35B:
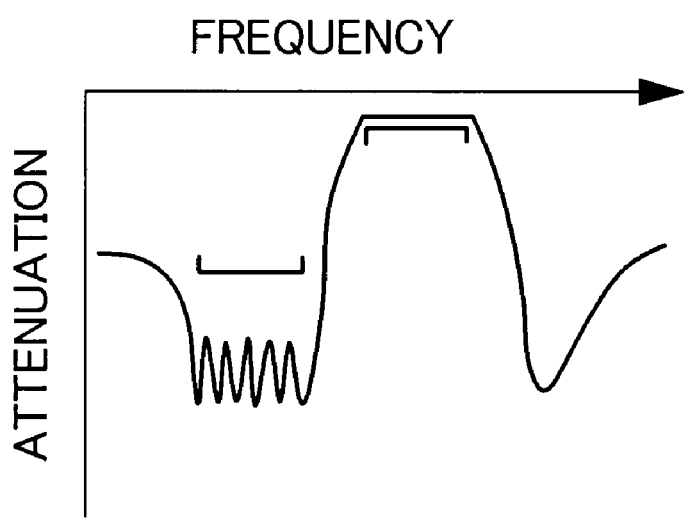
FIG. 35B is a graph showing a frequency characteristic of the reception filter according to the eleventh embodiment.

FIGS. 35A and 35B show the frequency characteristics of this embodiment. FIG. 35A shows the frequency characteristic of the transmission filter, and FIG. 35B shows the frequency characteristic of the reception filter.

The transmission filter and the reception filter have different pass frequency bands. Therefore, in each filter, the diameters of the resonance parts of series-arm resonators 1-2 and parallel-arm resonators 1-1 are optimized so that these resonators are most suitable for the corresponding pass frequency bands.

In the transmission filter 100A, as with the fifth embodiment, the diameters of the resonance parts of the series-arm resonators 1-2 and those of the parallel-arm resonators 1-1 are set to different values. Therefore, the series-arm resonators and the parallel-arm resonators have different frequencies. As shown in FIG. 35A, a frequency whose attenuation is rapidly increased from the series resonant frequency to the parallel resonant frequency of the series-arm resonators 1-2 is matched with a frequency at an end of a high-frequency passband, and a frequency whose attenuation is rapidly decreased from the series resonant frequency to the parallel resonant frequency of the parallel-arm resonators 1-1 is matched with a frequency at an end of a low-frequency passband. Thus, the transmission filter serves as a ladder-type band-pass filter. Further, in order to widen the width of a low-frequency stopband, the diameters of the resonance parts of the six parallel-arm resonators 1-1 are set to different values.

In the reception filter 100B, as with the transmission filter 100A, the diameters of the resonance parts of the series-arm resonators 1-2 and the parallel-arm resonators 1-1 are set to different values. Therefore, these resonators have different frequencies. As shown in FIG. 35B, a frequency whose attenuation is rapidly increased from the series resonant frequency to the parallel resonant frequency of the series-arm resonators 1-2 is matched with a frequency at an end of a high-frequency passband, and a frequency whose attenuation is rapidly decreased from the series resonant frequency to the parallel resonant frequency of the parallel-arm resonators 1-1 is matched with a frequency at an end of a low-frequency passband. Thus, the reception filter serves as a ladder-type band-pass filter. Further, in order to widen the width of a low-frequency stopband, the diameters of the resonance parts of the six parallel-arm resonators 1-1 are set to different values.

Thus, according to the eleventh embodiment, low-cost branching filters whose frequency characteristics are significantly improved are provided.

Twelfth Embodiment

While the fifth to eleventh embodiments have been described using the first embodiment as the resonators 1, it is apparent that use of the resonators according to the third and fourth embodiments as the resonators 1 also provides a similar advantage.

In the first to fourth embodiments, the piezoelectric material 5 having one layer is interposed between the upper electrode 3 and the lower electrode 4. However, without being limited to this configuration, the piezoelectric material 5 may include multilayered piezoelectric thin films, or include upper and lower piezoelectric thin films and a non-piezoelectric thin film interposed therebetween. Note that the piezoelectric material 5 must include at least one layer of a piezoelectric thin film.

What is claimed is:
1. A thin film piezoelectric bulk acoustic wave resonator comprising a resonance part including at least one vibration unit, a supporter that supports the resonance part, and an input/output terminal,
    wherein each of the at least one vibration unit having a multilayer structure comprising:
    a piezoelectric thin film;
    a first metal electrode film; and
    a second metal electrode film; wherein at least a part of the piezoelectric thin film is interposed between the first and second metal electrode films,
    wherein the piezoelectric thin film is polarized in a direction perpendicular to a film surface and vibrates in radial extension mode,
    wherein the supporter is connected onto an insulating substrate at a vibration node of the resonance part,
    wherein the resonance part comprises at least one connection part and a plurality of vibration units from the at least one vibration unit,
    wherein all of the plurality of vibration units and the at least one connection part are formed on the insulating substrate as films,
    wherein at least two of the plurality of vibration units connected to each other via the at least one connection part are symmetrical with respect to a plane,
    wherein the supporter is configured to hold the resonance part only at a center of the at least one connection part and having a plurality of electrical drawing lines,
    wherein the at least one connection part has a multilayer structure including a first metal electrode film, a second metal electrode film, and a piezoelectric thin film,
    wherein an elastic insulating layer is interposed between the at least two of the plurality of vibration units and the at least one connection part, and the insulating substrate,
    wherein the first metal electrode films of the at least two of the plurality of vibration units are electrically connected in direct current to each other via the at least one connection part,
    wherein the second metal electrode films of the at least two of the plurality of vibration units are electrically connected in direct, current to each other via the at least one connection part, wherein the piezoelectric thin films of the at least two of the plurality of vibration units are elastically connected to each other via the at least one connection part, wherein the first metal electrode films of the at least two of the plurality of vibration units are electrically connected in direct current to at least one of the plurality of electrical drawing lines via the first metal electrode film of the at least one connection part, wherein the second metal electrode films of the at least two of the plurality of vibration units are electrically connected in direct current to another at least one of the plurality of electrical drawing lines via the second metal electrode film of the at least one connection part, and wherein a width of the at least one connection part is one-fourth or less of a width of the at least two of the plurality vibration units.

2. A thin film piezoelectric vibrator comprising a resonance part including at least one vibration unit and a supporter that supports the resonance part, wherein the at least one vibration unit comprising a multilayer structure including:
a piezoelectric thin film;
a first metal electrode film; and
a second metal electrode film;
wherein at least a part of the piezoelectric thin film is configured interposed between the first and second metal electrode films, wherein the piezoelectric thin film is polarized in a direction perpendicular to a film surface and vibrates in radial extension mode, wherein the supporter is connected onto an insulating substrate at a vibration node of the resonance part, wherein the supporter has a multilayer structure common to the multilayer structure of the at least one vibration unit including the piezoelectric thin film and the first metal electrode film, and wherein the resonance part and the supporter are formed on the insulating substrate.

3. A thin film piezoelectric vibrator comprising a resonance part including at least one vibration unit and a supporter that supports the resonance part, wherein each of the at least one vibration unit comprising a multilayer structure including:
a piezoelectric thin film;
a first metal electrode film; and
a second metal electrode film;
wherein at least a part of the piezoelectric thin film is configured interposed between the first and second metal electrode films, wherein the piezoelectric thin film is polarized in a direction perpendicular to a film surface and vibrates in radial extension mode, wherein the supporter is connected onto an insulating substrate at a vibration node of the resonance part, wherein the resonance part comprises a pair of vibration units from the at least one vibration unit that are symmetrical with respect to a plane and a connection part that connects the pair of vibration units;

wherein the resonance part has the vibration node at a center of the connection part; and wherein the supporter is configured to hold the resonance part at the vibration node.

4. The thin film piezoelectric vibrator according to claim 3, wherein a width of the connection part is one-fourth or less of a width of the at least one vibration unit.

5. A thin film piezoelectric bulk acoustic wave resonator comprising a resonance part including at least one vibration unit, a supporter that supports the resonance part, and an input/output terminal, wherein each of the at least one vibration unit having a multilayer structure comprising:
a piezoelectric thin film;
a first metal electrode film; and
a second metal electrode film; wherein at least a part of the piezoelectric thin film is interposed between the first and second metal electrode films, wherein the piezoelectric thin film is polarized in a direction perpendicular to a film surface and vibrates in radial extension mode, wherein the supporter is connected onto an insulating substrate at a vibration node of the resonance part, wherein the resonance part comprises a pair of vibration units from the at least one vibration unit that are symmetrical with respect to a plane and a connection part that connects the pair of vibration units, wherein the resonance part has the vibration node at a center of the connection part, and wherein the supporter and the input/output terminals are connected at the vibration node.

6. A radio-frequency filter comprising:
an input terminal;
an output terminal; and
a resonance part and a supporter that supports the resonance part, the resonance part having an at least first and second thin film piezoelectric bulk acoustic wave radio-frequency resonators each including at least one vibration unit, wherein the at least one vibration unit has a multilayer structure including:
a piezoelectric thin film;
a first metal electrode film; and
a second metal electrode film, wherein at least a part of the piezoelectric thin film is interposed between the first and second metal electrode films, wherein the piezoelectric thin film is polarized in a direction perpendicular to a film surface and vibrates in radial extension mode with a center of the piezoelectric thin film used as a center of the radial extension, the supporter is connected onto an insulating substrate at a plurality of vibration nodes of the resonance part, wherein the first thin film piezoelectric bulk acoustic wave radio-frequency resonator connected to the input and output terminals in series and the second thin film piezoelectric bulk acoustic wave radio-frequency resonator connected to the input and output terminals in parallel, and wherein a width of the at least one vibration unit of the first thin film piezoelectric bulk acoustic wave radio-frequency resonator is smaller than that of the at least one vibration unit of the second thin film piezoelectric bulk acoustic wave radio-frequency resonator.

7. A radio-frequency filter comprising:
an input terminal;
an output terminal; and
a resonance part and a supporter that supports the resonance part, the resonance part having a plurality of thin film piezoelectric bulk acoustic wave radio-frequency resonators each including at least one vibration unit, wherein the at least one vibration unit has a multilayer structure including:
a piezoelectric thin film;

a first metal electrode film; and a second metal electrode film, wherein at least a part of the piezoelectric thin film is interposed between the first and second metal electrode films, wherein the piezoelectric thin film is polarized in a direction perpendicular to a film surface and vibrates in radial extension mode with a center of the piezoelectric thin film used as a center of the radial extension, the supporter is connected onto an insulating substrate at a plurality of vibration nodes of the resonance part, wherein the plurality of the thin film piezoelectric bulk acoustic wave radio-frequency resonators are connected to the input and output terminals in parallel, and a width of the at least one vibration unit of at least one of the plurality of thin film piezoelectric bulk acoustic wave radio-frequency resonators is different from a width of the at least one vibration unit of the other of the plurality of thin film piezoelectric bulk acoustic wave radio-frequency resonators.

8. A radio-frequency filter comprising:

an input terminal;

an output terminal; and a resonance part and a supporter that supports the resonance part, the resonance part having a plurality of thin film piezoelectric bulk acoustic wave radio-frequency resonators each including at least one vibration unit, wherein the at least one vibration unit has a multilayer structure including:

a piezoelectric thin film;

a first metal electrode film; and a second metal electrode film, wherein at least a part of the piezoelectric thin film is interposed between the first and second metal electrode films, wherein a the piezoelectric thin film is polarized in a direction perpendicular to a film surface and vibrates in radial extension mode with a center of the piezoelectric thin film used as a center of the radial extension, the supporter is connected onto an insulating substrate at a plurality of vibration nodes of the resonance part, wherein the plurality of the thin film piezoelectric bulk acoustic wave radio-frequency resonators are connected to the input and output terminals in series, and a width of the at least one vibration unit of at least one of the plurality of thin film piezoelectric bulk acoustic wave radio-frequency resonators is different from a width of the at least one vibration unit of the other of the plurality of thin film piezoelectric bulk acoustic wave radio-frequency resonators.

9. A radio-frequency filter comprising:

an input terminal;

an output terminal; and a resonance part and a supporter that supports the resonance part, the resonance part having a plurality of first resonators and a plurality of second resonators each of said plurality of first resonators and each of said plurality of second resonators comprises a thin film piezoelectric bulk acoustic wave radio-frequency resonator including at least one vibration unit, wherein the at least one vibration unit has a multilayer structure including:

a piezoelectric thin film;

a first metal electrode film; and a second metal electrode film, wherein at least a part of the piezoelectric thin film is interposed between the first and second metal electrode films, wherein the piezoelectric thin film is polarized in a direction perpendicular to a film surface and vibrates in radial extension mode with a center of the piezoelectric thin film used as a center of the radial extension, the supporter is connected onto an insulating substrate at a plurality of vibration nodes of the resonance part, wherein the plurality of first resonators are connected to the input and output terminals in series and the plurality of second resonators are connected to the input and output terminals in parallel, wherein each of the plurality of first resonators and each of the plurality of second resonators comprises a pair of vibration units from the respective at least one vibration unit that are symmetrical with respect to a plane and a connection part that connects the pair of vibration units, wherein each of the plurality of vibration nodes is located at a center of each of the corresponding connection parts, wherein the supporter is configured to hold the resonant part at the plurality of vibration nodes, and wherein the resonance part and the supporter are formed on the insulating substrate as films.

\* \* \* \* \*